US007090325B2

(12) United States Patent
Hashimoto et al.

(10) Patent No.: US 7,090,325 B2
(45) Date of Patent: Aug. 15, 2006

(54) LIQUID DROP DISCHARGE HEAD AND MANUFACTURE METHOD THEREOF, MICRO DEVICE INK-JET HEAD INK CARTRIDGE AND INK-JET PRINTING DEVICE

(75) Inventors: Kenichiroh Hashimoto, Kanagawa (JP); Tadashi Mimura, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 141 days.

(21) Appl. No.: 10/487,463

(22) PCT Filed: Sep. 4, 2002

(86) PCT No.: PCT/JP02/08995

§ 371 (c)(1),
(2), (4) Date: Feb. 20, 2004

(87) PCT Pub. No.: WO03/022584

PCT Pub. Date: Mar. 20, 2003

(65) Prior Publication Data

US 2004/0246292 A1 Dec. 9, 2004

(30) Foreign Application Priority Data

Sep. 6, 2001 (JP) ............................ 2001-270165
Jul. 23, 2002 (JP) ............................ 2002-213478

(51) Int. Cl.

| | |
|---|---|
| *B41J 2/015* | (2006.01) |
| *B41J 2/145* | (2006.01) |
| *B41J 2/04* | (2006.01) |
| *G11B 5/127* | (2006.01) |
| *H01L 21/302* | (2006.01) |
| *H01L 21/301* | (2006.01) |
| *K01L 21/30* | (2006.01) |

(52) U.S. Cl. ............................ 347/20; 347/40; 347/54; 216/27; 438/753; 438/462; 438/456

(58) Field of Classification Search ..................... None
See application file for complete search history.

(56) References Cited

U.S. PATENT DOCUMENTS

| | | | |
|---|---|---|---|
| 4,829,324 | A | 5/1989 | Drake et al. |
| 5,621,524 | A | 4/1997 | Mitani |
| 5,755,024 | A | 5/1998 | Drake et al. |
| 5,871,656 | A | 2/1999 | Silverbrook |
| 6,257,224 | B1 | 7/2001 | Yoshino et al. |
| 2001/0024217 | A1 | 9/2001 | Kanda et al. |

FOREIGN PATENT DOCUMENTS

| | | |
|---|---|---|
| EP | 0322228 | 11/1993 |
| EP | 0322228 B1 * | 11/1993 |

(Continued)

OTHER PUBLICATIONS

May 11, 2006 European Search Report.

*Primary Examiner*—Shih-Wen Hsieh
(74) *Attorney, Agent, or Firm*—Cooper & Dunham LLP

(57) ABSTRACT

A liquid drop discharge head includes a chip (21) that is formed by separation of a silicon wafer (20). The silicon wafer (20) has a first direction and a second direction which are mutually intersected. The chip (21) is separated from the silicon wafer (20) by etching the wafer along a separation line (22) parallel to the first direction of the wafer and by dicing the wafer (20) along a separation line (23) parallel to the second direction of the wafer.

18 Claims, 37 Drawing Sheets

FOREIGN PATENT DOCUMENTS

| | | | |
|---|---|---|---|
| EP | 0771658 | A2 | 5/1997 |
| EP | 1136269 | A2 | 9/2001 |
| JP | 56135942 | | 10/1981 |
| JP | 02-012110 | | 1/1990 |
| JP | 04130647 | | 5/1992 |
| JP | 05036825 | | 2/1993 |
| JP | 05285935 | | 11/1993 |
| JP | 07132595 | | 5/1995 |
| JP | 07276626 | | 10/1995 |
| JP | 09226112 | | 9/1997 |
| JP | 10157149 | | 6/1998 |
| JP | 2000326516 | | 11/2000 |
| JP | 0863231 | | 8/2001 |

* cited by examiner

LIQUID DROP DISCHARGE HEAD AND MANUFACTURE METHOD THEREOF, MICRO DEVICE INK-JET HEAD INK CARTRIDGE AND INK-JET PRINTING DEVICE

TECHNICAL FIELD

The present invention relates to a liquid drop discharge head which discharges a liquid drop from a nozzle, and its manufacture method, a micro device, an ink-jet head, an ink cartridge, and an ink-jet printing device.

BACKGROUND ART

An ink-jet head is a liquid drop discharge head used in an ink-jet printing device provided as an image recording device or an image forming device, such as a printer, a facsimile or a copier. The ink-jet head includes a nozzle which discharges the ink drop, a liquid chamber (also called pressurized liquid chamber, pressure chamber, discharge chamber, ink passage, etc.) which communicates with the nozzle for free passage, and a pressure generating means which generates the pressure to pressurize the ink in the liquid chamber. The ink drop is discharged from the nozzle by pressurizing the ink in the liquid chamber by the pressure generated by the pressure generating means.

As for other liquid drop discharge heads, for example, the liquid drop discharge head which discharges the liquid resist as the liquid drop, and the liquid drop discharge head which discharges the sample of DNA as the liquid drop are known.

In addition, as the micro device, for example, the actuator (or the optical switch) of a micro pump, the micro optical array, the micro switch (or the micro relay), and the multiple optical lens, the micro flow meter, the pressure sensor, etc. are known.

A description will be given of the ink-jet head as the example of representation.

There are three major types of the ink-jet heads: piezoelectric type, thermal type, and electrostatic type. The piezoelectric type discharges the ink drop by carrying out deformation and displacement of the diaphragm which forms the surface of a wall of the liquid chamber using electromechanical transducers, such as piezoelectric elements, as the pressure generating means. The thermal type discharges the ink by generating the bubble through the ink boiling using electro-thermal conversion elements, such as the heating resistors arranged in the liquid chamber. The electrostatic type discharges the ink drop by deforming the diaphragm through the electrostatic force using the diaphragm (or the integrally formed electrode) which forms the surface of a wall of the liquid chamber, and its opposing electrode.

In a conventional ink-jet head, the liquid chambers and the common liquid chamber which communicates with the respective liquid chambers are formed with the material, such as a photosensitive resin, a resin mold, metal or glass. However, since the rigidity of resin is insufficient, it is likely that the cross talk between the neighboring liquid chambers takes place, and there is the problem that the picture quality deteriorates.

Moreover, the rigidity of metal or glass is sufficient, and the problem of the cross talk does not take place. However, the manufacture processes of the metal or glass liquid chambers is difficult to perform. Further, for the conventional ink-jet head, it is becoming difficult to meet the recent demand for the ink-jet head having a high-density liquid chamber in order to attain good quality of a reproduced image.

Japanese Patent No. 3141652, Japanese Laid-Open Patent Application Nos. 7-276626 and 9-226112 disclose an ink-jet head in which the liquid chambers and the common liquid chamber are formed by the anisotropic etching of a silicon substrate (silicon wafer). The rigidity of silicon is high and the manufacturing processes thereof can be performed easily by using the anisotropic etching. The formation of a perpendicular surface of the liquid chamber wall is possible by using the silicon wafer of (110) crystalline orientation, and this makes it possible to configure the high-density liquid chamber.

When the silicon is used for the liquid-chamber formation member, it is necessary to form the plural liquid chambers and the common liquid chamber corresponding to the head chips on the silicon substrate (silicon wafer), and to separate the silicon substrate into the respective chips.

In this case, as a method of separating the silicon wafer into the chips, the dicing is generally used.

In the dicing, the cutter blade in which diamond powders are attached to the circumference thereof is rotated at high speed and moved along the cutting line, so that the silicon wafer is cut into chips.

For example, Japanese Laid-Open Patent Application No. 10-157149 discloses a silicon dicing method in which the adhesion of chippings in the dicing is eliminated. In the method of the above document, a predetermined separation pattern mask is formed on the silicon wafer, and anisotropic etching is performed so that the wafer is separated into chips by the V-shaped grooves.

Japanese Laid-Open Patent Application No. 5-36825 discloses another silicon dicing method in which the adhesion of chippings in the dicing is eliminated. In the method of the above document, the first and second V-shaped grooves are formed on the silicon wafer, and the concentrated stress is applied the first and second V-shaped grooves so that the wafer is separated into chips by the V-shaped grooves.

However, when performing the chip separation by the conventional dicing method, the cutting line is straight as shown in FIG. 27, and the respective chips 201 must be configured in the lattice formation on the silicon wafer 200. Depending on the size and form of the chip, the restrictions will be in the layout, and the non-used portion of the wafer will be increases. The number of the chips produced from a piece of silicone wafer will be decreased, and the manufacturing cost will be increased.

Moreover, the respective chips can be arranged with the same size only, and it is impossible to produce simultaneously the chips with different sizes.

On the other hand, the anisotropic etching method separates the silicon wafer into chips, and the degree of freedom of the layout of the chips on the wafer becomes large. There are the advantages that the chips with different configurations can be arranged on the same wafer, and that increasing the number of the chips produced is possible by arranging the chips in a staggered formationt.

However, when bonding the chip after the separation to other parts, it is necessary that the edge of the chip is brought into contact with the other parts in alignment. In this case, it is required that the edge of the chip is placed with good precision. However, when the separation is performed by anisotropic etching, the precision of the chip edge will no longer be ensured.

That is, when the separation is performed by anisotropic etching, the chip edge will be tapered, like a knife edge, due to crystal orientation, and good precision is not obtained.

When the thickness of the wafer has variations, the chip edge also varies and the precision of the edge deteriorates since the chip edge is tapered. Furthermore, the chip edge is tapered, and the precision of the edge deteriorates due to cracking during production.

Depending on crystal orientations of silicon, the straight-line edge is obtained by anisotropic etching. The reason that the straight-line edge is as follows. In a silicon wafer of (100) crystalline orientation, there are two <110> orientations which are intersected perpendicularly. However, in a silicon wafer of (110) crystalline orientation, there are two <112> orientations or two <110> orientations which are not intersected perpendicularly. In the latter case, the silicon wafer cannot be separated into rectangular or square chips.

When it is desired to separate the silicon wafer of (110) crystalline orientation into rectangular or square chips, the method of arranging the pattern in the shape of a straight line and forming the separation line may be used. However, in this case, the edge of the resulting chip becomes saw-like, or the projection is formed thereon, and such edge is unsuitable for alignment and it may produce particles. The quality of the bonding of the chip to the diaphragm or the nozzle plate deteriorates due to the particles.

Moreover, when separating the wafer by anisotropic etching and etching separates into the chips completely, there is also the problem that the resulting chips are separated apart in etching liquid. In this case, the collection of the chips is difficult. To avoid the problem, the V groove which does not penetrate the separation line is formed so that the wafer may not be separated into chips completely.

However, the silicon wafer in which the separation line is formed by anisotropic etching has very small hardness, and there is a possibility that the wafer is damaged during the subsequent process or conveyance.

Moreover, when separating the wafer into the chips, it pushes with the roller and the stress is applied, and the wafer is separated by the cleavage. Like an electronic device, the chip of a size below several square millimeters can be produced by the separation cutting along with the separation line formed by anisotropic etching. However, as for the micro device which is a comparatively large chip in which the through holes are formed or sub-chips of various sizes are arranged therein, it is likely that the chip is damaged due to a concentrated stress.

DISCLOSURE OF INVENTION

In order to overcome the above-described problems, an object of the present invention is to provide an improved liquid drop discharge head and its manufacture method, an improved micro device, an improved ink-jet head, an improved ink cartridge and an improved ink-jet printing device which increase the number of the resulting chips from the wafer by raising the degree of freedom of the chip arrangement on the wafer, provide easy positioning with other parts, and allow the manufacture with low cost.

In order to solve the above problems, the liquid drop discharge head of the present invention includes a head component chip formed by separation of a silicon wafer, the silicon wafer having a first direction and a second direction that are mutually intersected. The chip comprises: a first separation line parallel to the first direction of the silicon wafer, the chip being separated from the wafer along the first separation line by a first separation method; and a second separation line parallel to the second direction of the silicon wafer, the chip being separated from the wafer along the second separation line by a second separation method.

It is desirable that the chip is separated from the wafer along the first separation line by etching, and separated from the wafer along the second separation line by dicing.

In this case, it is desirable that the chip is configured in a rectangular formation having a longitudinal direction parallel to the second separation line in which the chip is separated from the wafer by dicing, and a lateral direction parallel to the first separation line in which the chip is separated from the wafer by etching.

Moreover, it is desirable that the silicon wafer is of (110) crystalline orientation, the chip is formed from the silicon wafer, and the first separation line of the chip being separated from the silicon wafer by etching is parallel to <112> orientation of the silicon wafer.

Moreover, it is desirable that the discharge head comprises a liquid-chamber formation member which provides a liquid chamber, a nozzle formation member which provides a nozzle, and an electrode formation member which provides an electrode, and that the chip constitutes at least one of the liquid-chamber formation member, the nozzle formation member, and the electrode formation member.

Furthermore, it is desirable that the chip is provided without any bridge portion at an intersection between the first separation line and the second separation line.

In order to solve the above problems, the manufacture method of the liquid drop discharge head of the present invention comprises the steps of: etching the silicon wafer along first separation lines parallel to the first direction of the silicon wafer in order to separate a plurality of chips from each other along the first separation lines; and dicing the silicon wafer along second separation lines parallel to the second direction of the silicon wafer to separate the plurality of chips from the silicon wafer along the first and second separation lines.

It is desirable that each of the plurality of chips is configured in a rectangular formation having a longitudinal direction parallel to the second separation line in which the chip is separated from the silicon wafer by the dicing step, and a lateral direction parallel to the first separation line in which the chip is separated from the silicon wafer by the etching step.

In this case, it is desirable that the silicon wafer is of (110) crystalline orientation, and the plurality of chips, configured in a rectangular formation, are arranged in the silicon wafer, and the first separation lines for the plurality of chips to be separated from the silicon wafer by the etching step are parallel to <112> orientations of the silicon wafer.

In this case, it is desirable that the first separation lines for the plurality of chips to be separated from the silicon wafer by the etching step are set to be 1 micrometers or more in width.

In order to solve the above problems, the manufacture method of the liquid drop discharge head of the present invention comprises the steps of: etching the silicon wafer along first separation lines parallel to the first direction of the silicon wafer, in order to separate a plurality of chips from the silicon wafer along the first separation lines; and dicing the silicon wafer along second separation lines parallel to the second direction of the silicon wafer, in order to separate the plurality of chips from the silicon wafer along the second separation lines. In the manufacture method, the etching step is performed such that the individual chips are not completely separated after the etching step, and the dicing step is performed so that the individual chips are completely separated after the dicing step.

It is desirable that the plurality of chips are arranged in a set of rows of chips in parallel with the first direction of the silicon wafer such that the first separation lines of adjacent rows of the chips are staggered in a direction parallel to the second separation lines.

In this case, it is desirable that the second separation lines are provided such that the second separation line of one of the plurality of chips has a width large enough to project to a range of a neighboring chip on said one of the plurality of chips in the silicon wafer.

Moreover, it is desirable that the plurality of chips are separated from the silicon wafer without any bridge portions at intersections between the first separation lines and the second separation lines.

It is desirable that the etching step is performed to form the first separation lines in the silicon wafer by etching from both top and bottom surfaces of the silicon wafer at the same time.

It is desirable that the etching step is performed to form the first separation lines in the silicon wafer by etching, at the same time as formation of a head component chip structure.

In order to solve the above problems, the micro device of the present invention includes a chip formed by separation of a silicon wafer, and this chip is provided similar to the head component chip in the liquid drop discharge head of the invention. In the micro chip, the first and second separation methods are different from each other and selected from among dicing, etching, sand blasting, wire saw processing, water jet processing, and laser processing.

According to the liquid drop discharge head of the present invention, the head component chip is separated from the silicon wafer by etching the wafer along the separation line parallel to the first direction of the wafer and by dicing the wafer along the separation line parallel to the second direction of the wafer. It is possible to provide easy positioning with other parts. The degree of freedom of the chip arrangement on the silicon wafer is raised, and the number of the resulting chips from the silicon wafer is increased. Thus, the yield improves, and low-cost manufacture can be attained.

According to the manufacture method of the liquid drop discharge head of the present invention, the degree of freedom of the chip arrangement on the silicon wafer is raised, and the number of the resulting chips from the silicon wafer is increased. Thus, the yield improves, and low-cost manufacture can be attained.

According to the micro device of the present invention, the micro device is provided a kind of the liquid drop discharge head of the invention, the number of the resulting chips from the silicon wafer is increased, the yield improves, and low-cost manufacture can be attained.

According to the ink-jet head of the present invention, the ink-jet head is provided as a kind of the liquid drop discharge head of the invention, and the productivity of the ink-jet head can be raised and low-cost manufacture can be attained.

According to the ink cartridge of the present invention, the ink tank which supplies the ink to the ink-jet head, and the ink-jet head which discharges the ink drop are integrally formed, and the liquid drop discharge head of the invention is provided as the ink-jet head. The productivity of the ink cartridge can be raised and low-cost manufacture can be attained.

According to the ink-jet printing device of the present invention, the liquid drop discharge head of the invention is provided as the ink-jet head which discharges the ink drop, and the productivity of the ink-jet printing device can be raised and low-cost manufacture can be attained.

BEST MODE FOR CARRYING OUT THE INVENTION

A description will now be provided of a first preferred embodiment of the present invention with reference to the accompanying drawings.

First, the ink-jet head of the first preferred embodiment of the liquid drop discharge head of the present invention will be explained with reference to FIG. 1 and FIG. 2.

Figure 1:
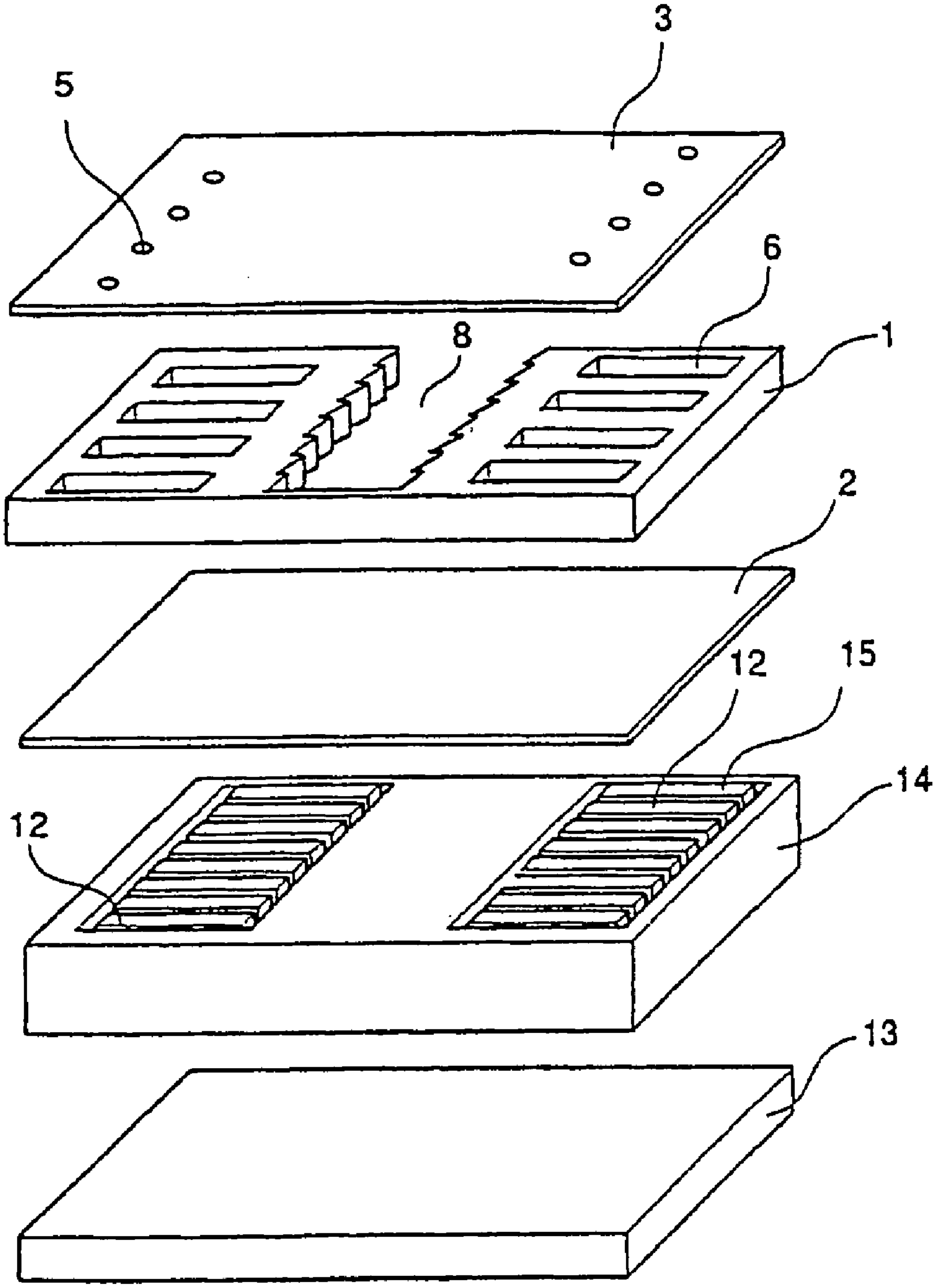
FIG. 1 is a perspective exploded view of the ink-jet head of the first preferred embodiment of the liquid drop discharge head of the present invention.
Figure 2:
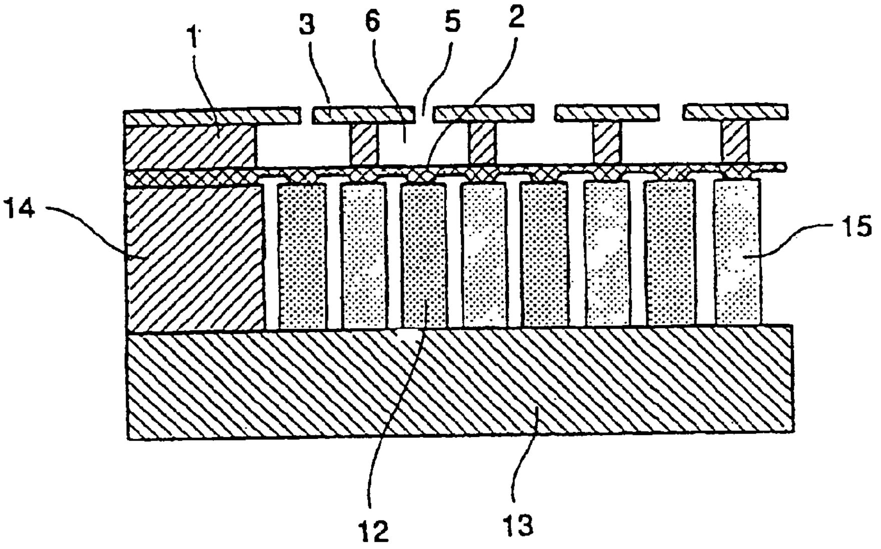
FIG. 2 is a sectional view of the ink-jet head of the first preferred embodiment taken along the line parallel to the lateral direction of the liquid chamber.

FIG. 1 shows the ink-jet head of the present embodiment. FIG. 2 is a sectional view of the ink-jet head of the present embodiment taken along the line parallel to the lateral direction of the liquid chamber.

The ink-jet head of this embodiment includes the passage formation substrate 1 (the liquid-chamber substrate) which is a liquid-chamber formation member formed by single-crystal silicon, and the liquid-chamber formation member serves as the chip structure.

The ink-jet head includes the diaphragm 2 bonded to the bottom surface of the passage formation substrate 1, and the nozzle plate 3 bonded to the top surface of the passage formation substrate 1.

The ink-jet head includes the common liquid chamber 8 which supplies the ink to the pressurized liquid chamber 6 which is the passage (ink liquid chamber) which communicates with the nozzle 5 which discharges the ink drop, and the pressurized liquid chamber 6 through the ink supply way used as the fluid resistance section is formed. On the outside (the liquid-chamber 6 side) of the diaphragm 2, the piezoelectric device 12 corresponding to each pressurized liquid chamber 6 is provided a drive means and bonded there. Each piezoelectric device 12 is bonded to the base substrate 13. On the circumference of the sequence of the piezoelectric devices 12, the spacer member 14 is bonded to the base substrate 13.

In addition, the pillar member 15 which is provided as the piezoelectric device is arranged between the piezoelectric devices 12. The piezoelectric device 12 is formed by laminating the piezoelectric-material layer and the internal electrode alternately.

In the present embodiment, the composition which pressurizes the ink in the pressurized liquid chamber 6 by using the displacement in the d33 direction as a direction of the piezoelectricity of the piezoelectric device 12 is possible. Moreover, the composition which pressurizes the ink in the pressurized liquid chamber 6 by using the displacement in the d31 direction as a direction of the piezoelectricity of the piezoelectric device 12 is possible.

The passage formation substrate 1 is formed by carrying out anisotropic etching of the substrate of the single-crystal-silicon of the crystalline orientation (110) using the alkali etching liquid, such as potassium hydroxide aqueous solution (KOH). The through hole is formed in the substrate 1 to provide each pressurized liquid chamber 6, and the through hole is formed in the substrate 1 to provide the common liquid chamber 8. Each pressurized liquid chamber 6 is divided by the partition wall.

The diaphragm 2 is formed from a metal plate of nickel, and is produced by the electro forming method. The nozzle plate 3 is provided to form the nozzle 5 with a diameter of 10–30 micrometers corresponding to each pressurized liquid chamber 6, and it is bonded to the passage formation substrate 1 by adhesive.

As the source material of the nozzle plate 3, the combination of metals, such as stainless steel and nickel, the metal and the resin, such as a polyimide resin film or silicon, and other combinations including these materials can be used.

Moreover, in order to secure the water repellence with the ink, the water-repellent film is formed on the nozzle side (the discharge side surface in the discharging direction) by using a known method, such as the plating, the coating or the water-repellent coating.

In the ink-jet head of the present embodiment, the piezoelectric device 12 is displaced in the lamination direction when the pulsed driving voltage of 20–50V is selectively applied to the piezoelectric device 12. The diaphragm 2 is also displaced in the nozzle 5 direction, and the ink in the pressurized liquid chamber 6 is pressurized by the volume change of the pressurized liquid chamber 6, so that the ink drop is discharged from the nozzle 5.

And in connection with the discharge of the ink drop, the fluid-pressure power in the pressurized liquid chamber 6 declines, and a certain negative pressure occurs in the pressurized liquid chamber 6 according to the inertia of the ink flow at this time.

The diaphragm 2 returns to the original position and the pressurized liquid chamber 6 becomes the original form by turning the voltage applied to the piezoelectric device 12 into the OFF state, and the negative pressure occurs further.

At this time, the pressurized liquid chamber 6 is filled with the ink through the ink supply way which is the common liquid chamber 8 and the fluid resistance section from the ink feed passage.

Then, after the ink meniscus surface of the nozzle 5 is vibrated and stabilized, the pulsed driving voltage is applied to the piezoelectric device 12 for the following ink drop discharge, and the ink drop is discharged from the nozzle 5.

The passage formation substrate 1 which includes the silicon substrate constituting the liquid chamber 6 and the common liquid chamber 8 in the ink-jet head is produced by applying the manufacture method of the present invention.

A description will be given of the first preferred embodiment of the manufacture method of the liquid drop discharge head of the present invention with reference to FIG. 3 through FIG. 5.

Figure 3:
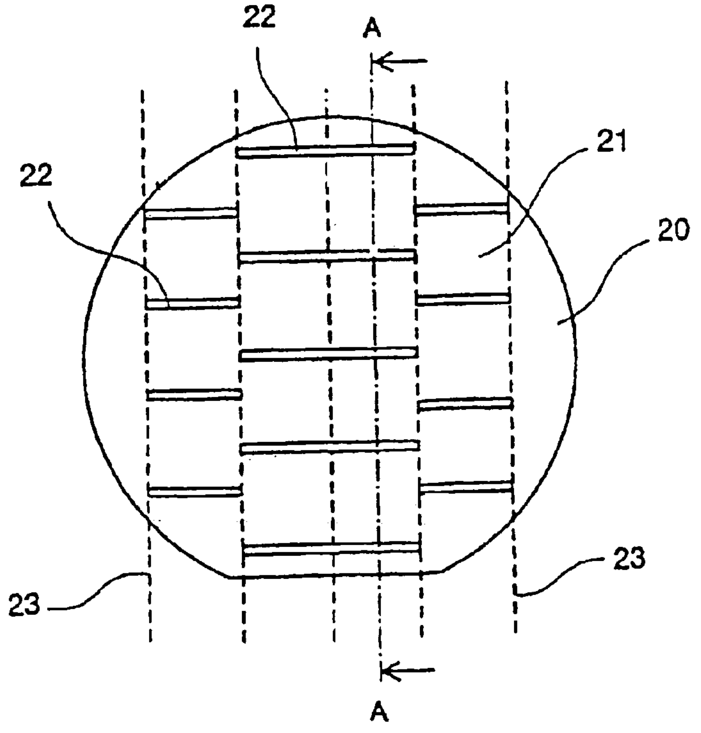
FIG. 3 is a diagram showing the chip arrangement on the wafer in order to explain the first preferred embodiment of the manufacture method of the liquid drop discharge head of the present invention.

FIG. 3 shows the chip arrangement on the silicon wafer 20 in order to explain the manufacture method of the present embodiment. The chip 21 in the wafer 20 of FIG. 3 constitutes the passage formation substrate 1 of the ink-jet head mentioned above. FIG. 4 shows the strip-like chip that is separated from the wafer 20. FIG. 5 is a sectional view of the chip taken along the line A—A indicated in FIG. 3.

In the present embodiment, the silicon wafer 20 of (100) crystalline orientation is used. As shown in FIG. 3, the separation lines in the lateral direction of the chip 21 are the etching separation lines 22 by anisotropic etching, and the lengthwise separation lines indicated by the dotted lines in FIG. 3 are the dicing separation lines 23 by dicing.

Figure 5:
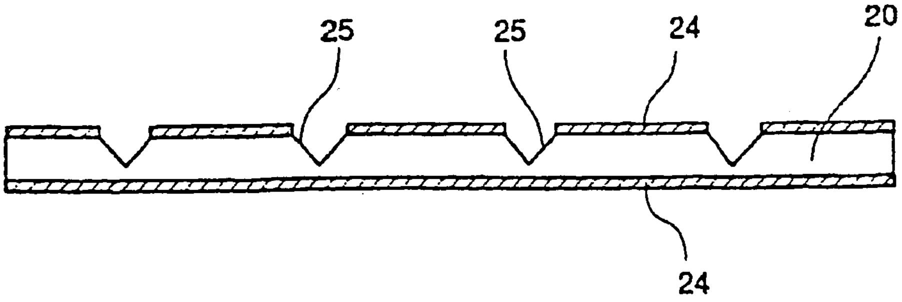
FIG. 5 is a sectional view of the chip taken along the line A—A line indicated in FIG. 3.

As shown in FIG. 5, the etching-proof layers 24, such as the silicon oxide and the silicon nitride, are formed on the silicon wafer 20, and the patterning is made in the form of the etching separation lines by using the photolithography technology, and it is removed.

The pattern of the etching separation lines 22 is formed in the direction parallel to the <110> orientations of the silicon wafer.

Then, the openings of the etching-proof layers 24 are etched by using the alkali liquid, such as potassium hydroxide (KOH) aqueous solution, TMAH (tetra-methyl ammonium aqueous solution), EDP (ethylenediamine pyrocatechol), or lithium hydroxide (LiOH).

In this case, in the anisotropic etching of the silicon wafer of (100) crystalline orientation by using the alkali liquid, the tapered surfaces 25 of (111) orientation are formed to be at 54.7-degree angles to the wafer surface.

When the two tapered surfaces 25 are met, the V groove is formed and the etching will not progress.

The depth of the V groove is determined by the width of the pattern, and it is necessary to design it from the wafer thickness and the required amount of the remaining parts.

Figure 4:
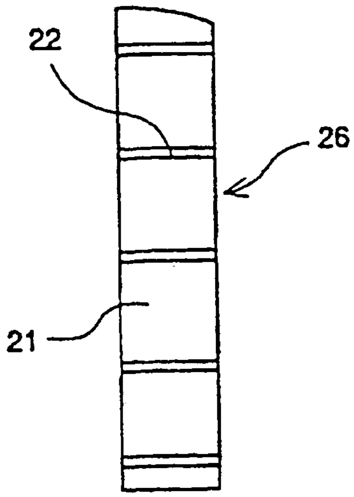
FIG. 4 is a diagram showing the strip-like chip that is separated from the wafer.

By carrying out the dicing of the wafer 20 (in which the etching separation lines 22 are formed) along the dicing separation lines 23 that are perpendicular to the etching separation lines 22, the strip-like chip 26 shown in FIG. 4 is produced.

Since the etching separation lines 22 are already formed, by applying the stress to carry out the cleavage of the strip-like chip 26, the strip-like chip 26 is separated into the individual chips 21 easily.

According to the present embodiment, in FIG. 3 and FIG. 4, the wafer is separated lengthwise into the chips 21 by the dicing. The precision of the edges of the chip is kept at a high level, and the precision at the time of positioning to other parts which contact the chip will be kept at a high level.

Moreover, the cross section of the chip does not become tapered but is perpendicular, and cracking of the chip does not occur when positioning.

Figure 27:
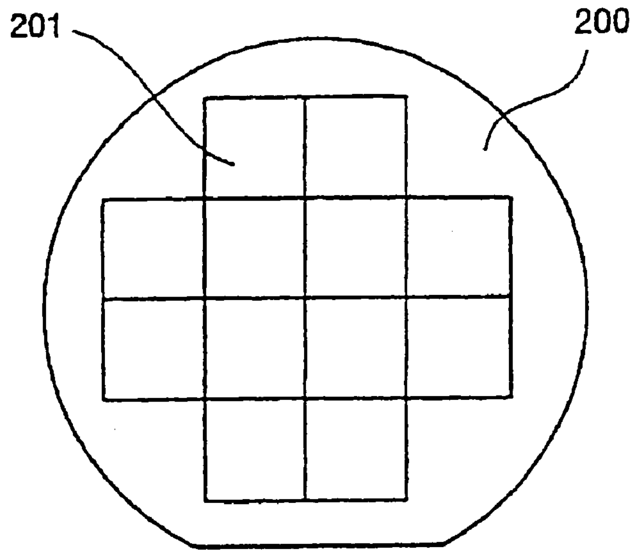
FIG. 27 is a diagram for explaining a conventional chip arrangement on the silicon wafer.

Furthermore, the wafer is separated laterally into the chips by etching, the degree of freedom of the chip arrangement on the wafer becomes large, and the number of the resulting chips produced from the wafer is larger than that of the conventional chip arrangement shown in FIG. 27.

Moreover, the cleavage in alignment with the etching separation lines 22 can be easily performed with the strip-like chip 26, and the damaging of the chip such as when carrying out the cleavage with the wafer is prevented, and the yield improves.

One method to attain a high-speed ink-jet printing device is to increase the number of the nozzles of the ink-jet head, and the chip of the ink-jet head will be configured in an elongated slender form with the increased number of the nozzles.

Figure 6:
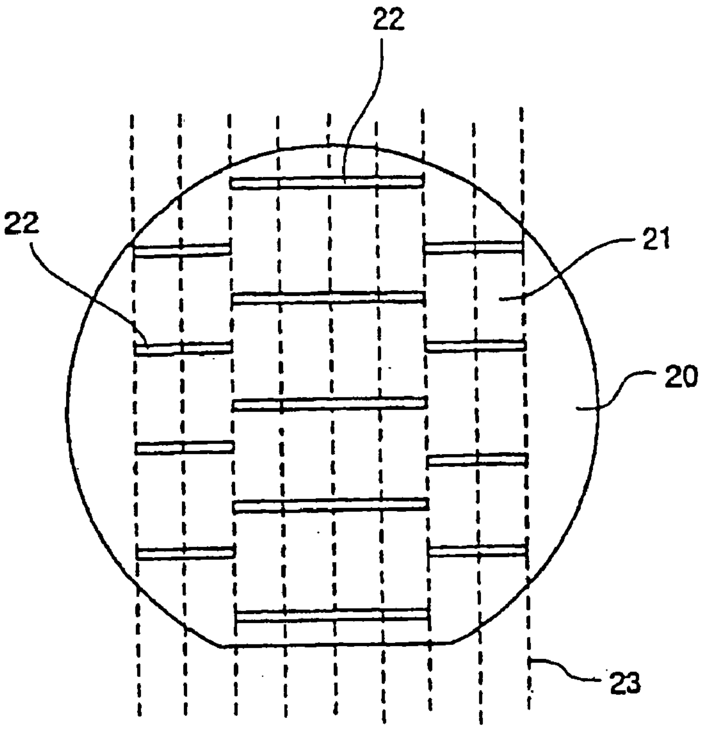
FIG. 6 is a diagram showing the chip arrangement on the wafer in order to explain another example of the manufacture method of the first preferred embodiment.

In the case of such rectangular chip, as shown in FIG. 6, it is desirable to use the etching separation according the orientation of the short side of the chip 21 by the etching separation lines 22 and the dicing separation according to the orientation of the long side of the chip 21 by the dicing separation lines 23.

When it becomes the strip-like chip by the dicing, the etching separation lines 22 are already on the short side of the chip 21, and the cleavage can be performed easily. There is little breakage of the chip and the yield improves.

Moreover, when carrying out the positioning of the rectangular chip 21 to other parts, the precision is kept at a high level if the positioning is performed in the longitudinal direction of the chip.

Therefore, by separating the wafer in the orientation of the long side of the chip by the dicing, the precision of the separation lines is kept at a high level and the cross section is also perpendicular, and the precision is kept at a high level.

Next, the second preferred embodiment of the manufacture method of the liquid drop discharge head of the invention will be explained with reference to FIG. 7 through FIG. 9.

Figure 7:
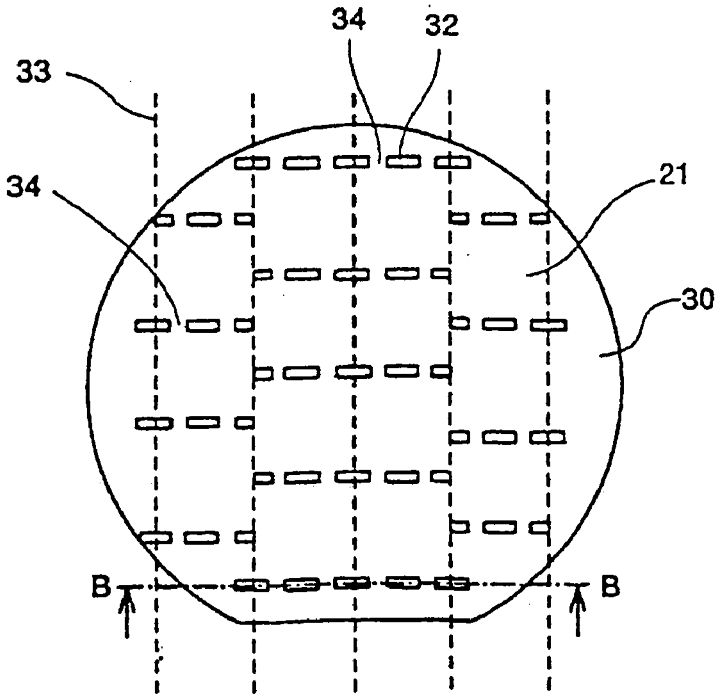
FIG. 7 is a diagram showing the chip arrangement on the wafer in order to explain the second preferred embodiment of the manufacture method of the liquid drop discharge head of the present invention.

FIG. 7 shows the chip arrangement on the silicon wafer 30 in order to explain the manufacture method of the present embodiment. FIG. 8 is a sectional view of the wafer taken along the line B—B indicated in FIG. 7. FIG. 9 shows the strip-like chip that is separated from the wafer of FIG. 7.

In the present embodiment, the silicon wafer 30 of (110) crystalline orientation is used.

As shown in FIG. 7, an etching separation line 32 is formed in the <112> orientations of the silicon wafer 30 of (110) crystalline orientation.

In the silicon wafer 30 of (110) crystalline orientation, the perpendicular (111) to the wafer side is formed by the pattern of the <112> orientations.

Therefore, if etching does not stop like etching of the silicon wafer of (100) crystalline orientation in V groove and etching time is lengthened, an etching separation line will be penetrated to the back of the wafer.

Therefore, by forming an etching separation line 32 in the <112> orientations, width of an etching separation line 32 can be made small, and wafer area can be used effectively.

Figure 8:
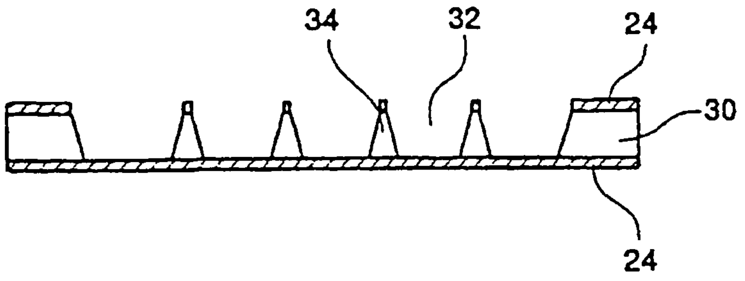
FIG. 8 is a sectional view of the wafer taken along the line B—B indicated in FIG. 7.
Figure 9:
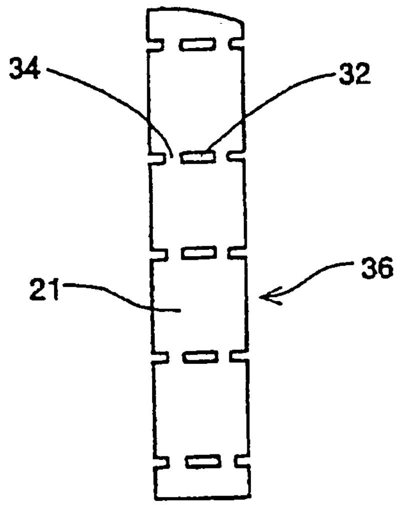
FIG. 9 is a diagram of the strip-like chip that is separated from the wafer.

Moreover, as shown in FIG. 7 and FIG. 8, an etching separation line 32 is made into the dotted line.

Even if an etching separation line 32 penetrates to the wafer side by doing in this way, the bridge 33 is formed and retained between the chips 21.

The strip-like chip 36 is obtained after the dicing and it separates into each chip 21 by applying and carrying out the cleavage of the stress to the bridge 33 during the chip 21.

In addition, in the wafer 30 back, the etching-proof film 24 remains also in the penetration section.

Since the thickness is several 10 nm–about 2 micrometers, there is no hardness to the extent that the chip is retained.

It is necessary to remove the etching-proof layer 24, after forming an etching separation line 32 by anisotropic etching, when the etching-proof film which remains in the opening breaks and there is a problem that the particles are produced at the time of the cleavage.

Moreover, with the wafer of (110) crystalline orientation, since etching form serves as the parallelogram with the angle of 70.5 degrees or 54.7 degrees, and the hexagon, in a straight line, an etching separation line of the orientation which intersects perpendicularly in the <112> orientations cannot be formed.

Although the small pattern can be put in order and formed when forming an etching separation line in the orientation which intersects perpendicularly in the <112> orientations, the edge of the chip will become saw-like in that case.

Then, since an etching separation line is formed in the <112> orientations in which the straight line is obtained by etching and the dicing separated the orientation perpendicular to the <112> orientations, the edge of the chip is formed with the sufficient precision here.

Moreover, in order to be able to stand the liquid chamber in a line with high density with the ink-jet head, it is effective to form the partition wall of the liquid chamber perpendicularly using the silicon substrate of (110) crystalline orientation.

In order to form the partition wall of the liquid chamber perpendicularly, the liquid chamber makes the orientation of the straight side in agreement in the <112> orientations of the silicon wafer, forms it, and arranges many liquid chambers in the orientation perpendicular to the <112> orientations.

Consequently, chip form turns into rectangle form long in the orientation perpendicular to the <112> orientations.

According to the present embodiment, since the orientation of the straight side of the chip will be separated by the dicing, the edge of the long side of the chip can be obtained with the sufficient precision, and can contact against other parts, jigs, etc., and positioning can carry out with the sufficient precision.

Furthermore, width of the chip separation line at the time of using the silicon wafer of (110) crystalline orientation is made theoretic without limit thinly.

However, if air bubbles are generated at the time of anisotropic etching and the air bubbles are shut up into the thin groove, etching liquid will no longer be supplied into the groove, and etching will not progress.

In order not to shut up air bubbles into the groove, as for the width of the chip separation line 32, it is desirable that it is 3 micrometers or more.

The still thinner groove can etch by using the mechanism which applying the supersonic wave during etching etc. drives out the blister in the thin groove compulsorily, and improves the circulation of the liquid in the groove, and 1 micrometers or more are desirable also at that case.

Next, the third preferred embodiment of the manufacture method of the liquid drop discharge head of the present invention will be explained with reference to FIG. 10.

Figure 10:
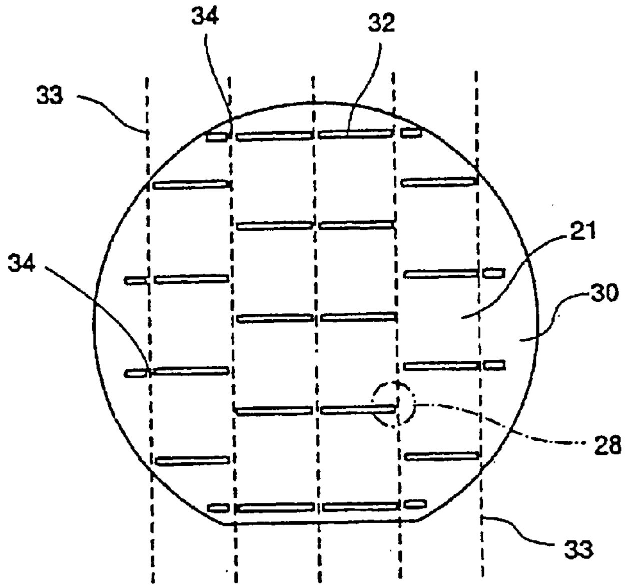
FIG. 10 is a diagram showing the chip arrangement on the wafer in order to explain the third preferred embodiment of the manufacture method of the liquid drop discharge head of the present invention.

FIG. 10 shows the chip arrangement on the silicon wafer 30 in order to explain the manufacture method of the present embodiment.

In the present embodiment, the wafer is separated completely, and it is separated along the etching separation line by the etching after the dicing is made to separate it along the dicing separation line. That is, the bridge portion 34 is located at an intersection between the etching separation line 32 and the dicing separation line 33 as in the second preferred embodiment previously mentioned.

When the dicing is performed to separate the chip 31 from the wafer 30, the bridge 34 on the etching separation line 32 is also cut together by the dicing, and the chip separation is completely performed at the end of the dicing.

In the present embodiment, the width of the bridge 34 has the desirable one narrower than the width of the dicing separation line 33, and since it does not produce the remains of the bridge 34 at the edge of the chip 31 by the dicing, the manufacture method of the present embodiment can prevent generating of the particles on the chip due to the bridge remains at the next process.

Next, the fourth preferred embodiment of the manufacture method of the liquid drop discharge head of the present invention is explained with reference to FIG. 11.

Figure 11:
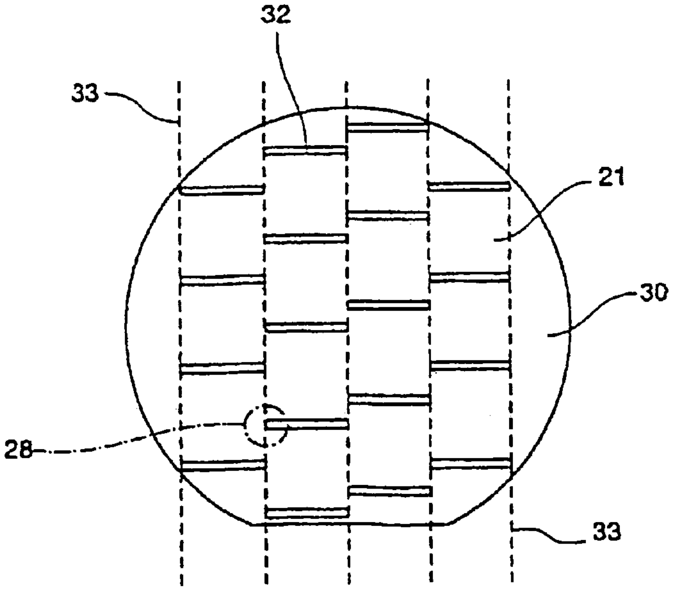
FIG. 11 is a diagram showing the chip arrangement on the wafer in order to explain the fourth preferred embodiment of the manufacture method of the liquid drop discharge head of the present invention.

FIG. 11 shows the chip arrangement on the silicon wafer 30 in order to explain the manufacture method of the present embodiment.

Similarly, in the present embodiment, the wafer is separated completely, and it is separated along the etching separation line by the etching after the dicing is made to separate it along the dicing separation line. The chips 21 are arranged in a set of rows of chips in parallel with the first direction of the silicon wafer 30 such that the first separation lines 32 of adjacent rows of the chips are staggered in a direction parallel to the second separation lines 33.

Thus, since the etching separation lines 32 do not turn into the long straight line by the arrangement, it can prevent increasing of the hardness of the wafer after the etching separation line 32 formation, and damaging of the wafer due to the cleavage being carried out by the etching separation lines during the wafer conveyance.

In this case, all the adjacent chip rows do not necessarily need to be staggered completely, and it is adequate that the chip arrangement is designed suitably with the wafer hardness, the chip form, or the chip size.

Next, the relationship between the etching separation lines 32 and the dicing separation lines 33 is explained with reference to FIG. 12 through FIG. 14.

Figure 12:
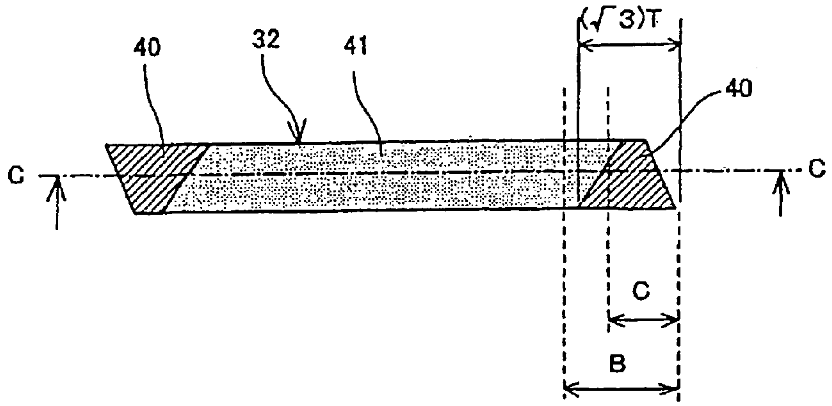
FIG. 12 is an enlarged view of a pattern which constitutes an etching separation line.
Figure 13:
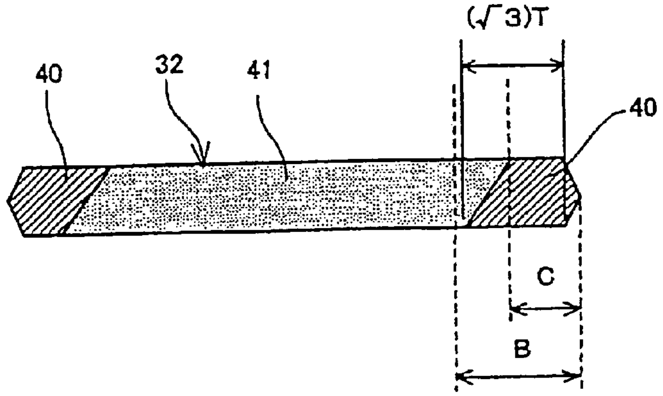
FIG. 13 is an enlarged view of another pattern which constitutes an etching separation line.

FIG. 12 is an enlarged view of the bridge portion 28 in FIG. 10, and FIG. 13 is an enlarged view of the bridge portion 28 in FIG. 11.

In the case of the silicon wafer of (110) crystalline orientation, as shown in FIG. 12 or FIG. 13, the etching form serves as the parallelogram or the hexagon.

Whether it becomes the parallelogram or the hexagon depends on the etching mask form being used.

The tapered surfaces 40 of the (111) orientations appear at the end portions as indicated by the shading lines in FIG. 12 or FIG. 13, and the length of each tapered surfaces 40 is proportional to the thickness T of the silicon wafer, and is expressed by ($\sqrt{3}$)T.

The silicon wafer is penetrated in the portion of 41 by etching.

In FIG. 12 and FIG. 13, the dotted line shows the dicing separation line 33, and the dicing separation line 33 changes with the width B or the width C which is determined by the width of the dicing blade.

The width B and the width C of the dicing separation line 33 are shown in FIG. 12 and FIG. 13 as comparative examples, and not restricted to them.

When the width of the dicing separation line 33 is equal to "B", any portion of the tapered surface 40 does not remain in the circumference of the separated chip. However, when the width of the dicing separation line 33 is equal to "C", the taper remains 42 of the tapered surface 40 as shown in FIG. 14 are left at the edges of the separated chip 21.

Since the taper remains 42 serve as the point-sharpened edges of the chip 21, there is a possibility of the damaging of the chip at the next process and the particles may be produced.

It is determined by the thickness T of the wafer and the thickness of the dicing blade whether the taper remains 42 will be left.

The wafer thickness does not come from the conditions which can break neither the design and the wafer nor the chip, and can seldom be chosen freely.

Figure 15:
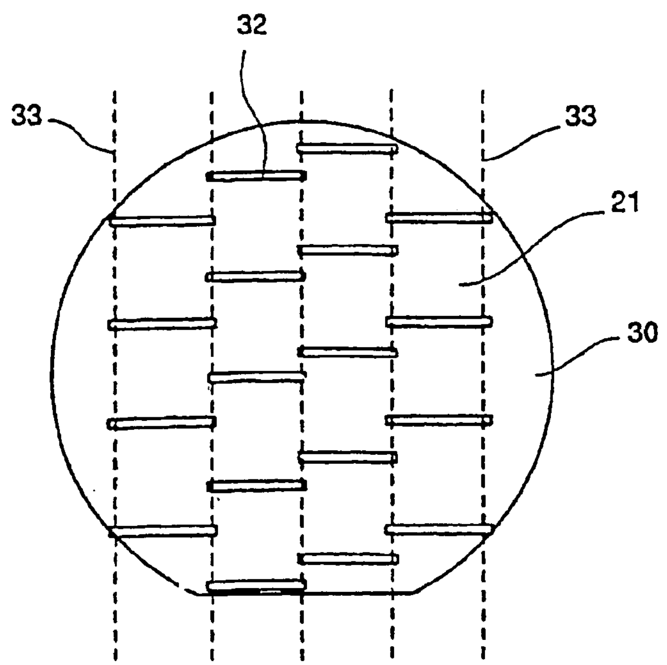
FIG. 15 is a diagram showing the chip arrangement on the wafer in order to explain the fifth preferred embodiment of the manufacture method of the liquid drop discharge head of the present invention.

Then, the fifth preferred embodiment of the manufacture method of the liquid drop discharge head of the present invention is explained with reference to FIG. 15.

In the present embodiment, it extends and forms until it starts the chip 21 which adjoins the etching separation line 32.

It is possible to prevent, by doing in this way, the damaging of the chip without the taper remains at the back process by the dicing, and the particles do not occur.

The circumference is minute although the dig lump of an etching separation line 32 will be formed also in the contiguity chip 21 since an etching separation line 32 is being prolonged for the adjoining chip in case it is used as an ink-jet head, it does not become the problem at all.

Moreover, in the chopper dicing which takes down on the wafer the dicing blade which carries out high-speed rotation, and can cut the part within the wafer side alternatively, since the blade is circular, the length of the cutting plane line differs on the wafer top surface and the bottom surface.

When chopper dicing is used for etching separation line formation of the present embodiment, the gap of the cutting plane line of the top surface and the bottom surface of the wafer can be absorbed by making it a part of separation line start the contiguity chip.

Next, the formation method of an etching separation line of the wafer is explained with reference to FIG. 16.

Figure 16:
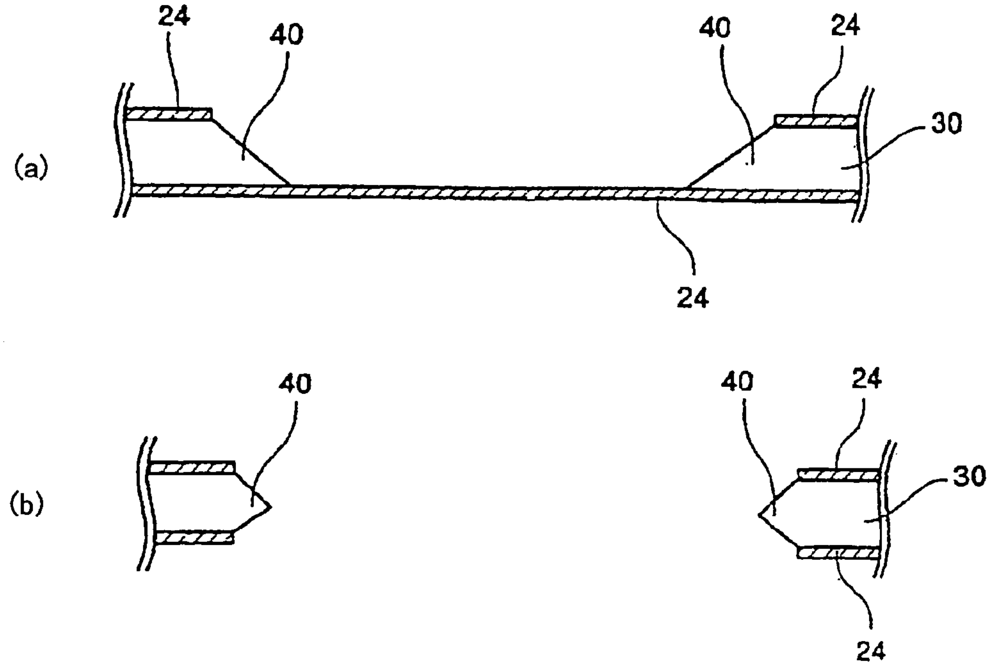
FIG. 16 is a sectional view of the wafer for explaining the method of forming an etching separation line.

FIG. 16 is a sectional view of the silicon wafer for explaining the method of forming an etching separation line in the wafer.

The taper 40 is formed in right and left, when FIG. 16 (*a*) expresses the cross section which meets the C—C line of FIG. 12 and an etching separation line 32.1*s* formed by etching from one side of the wafer 30.

On the other hand, FIG. 16 (*b*) expresses the case where carried out the patterning of the etching-proof layer 24, performed etching to both sides of the wafer 30 from both sides, and an etching separation line 32 is formed in them.

Figure 14:
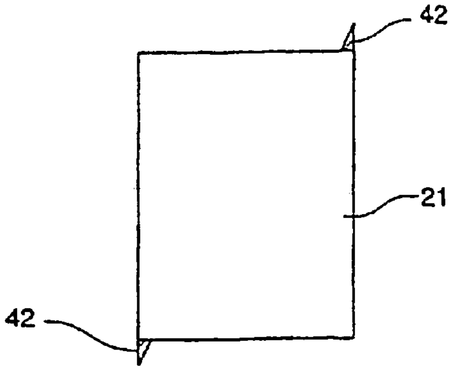
FIG. 14 is a diagram for explaining taper remains produced in chip separation.

The half of etching from one side is sufficient as the depth dug deep by performing etching from both sides until it penetrates the wafer 30, it becomes, therefore the length of the taper 40 becomes half, and without the taper remains 42 as shown in FIG. 14, it is possible to prevent the remaining of the taper remains at the back process, and the particles do not occur.

Figure 17:
FIG. 17 is a sectional view of the wafer for explaining another example of the method of forming an etching separation line.

In this case, if etching is further performed after the taper from both sides collides with, etching of the taper can progress, and as shown in FIG. 17, finally the taper 40 can also be lost completely.

Next, the sixth preferred embodiment of the manufacture method of the liquid drop discharge head of the present invention is explained with reference to FIG. 18.

This view is the cross-section diagram which meets in the array orientation of the liquid chamber of the wafer, and shows a part for the one chip of the wafer for convenience.

In the present embodiment, shortening of the process is aimed at by forming the liquid chamber 6 and the common liquid chamber 8 at the same time it forms an etching separation line 32, since the liquid chamber 6 the common liquid chamber 8, etc. are formed by anisotropic etching.

Figure 18:
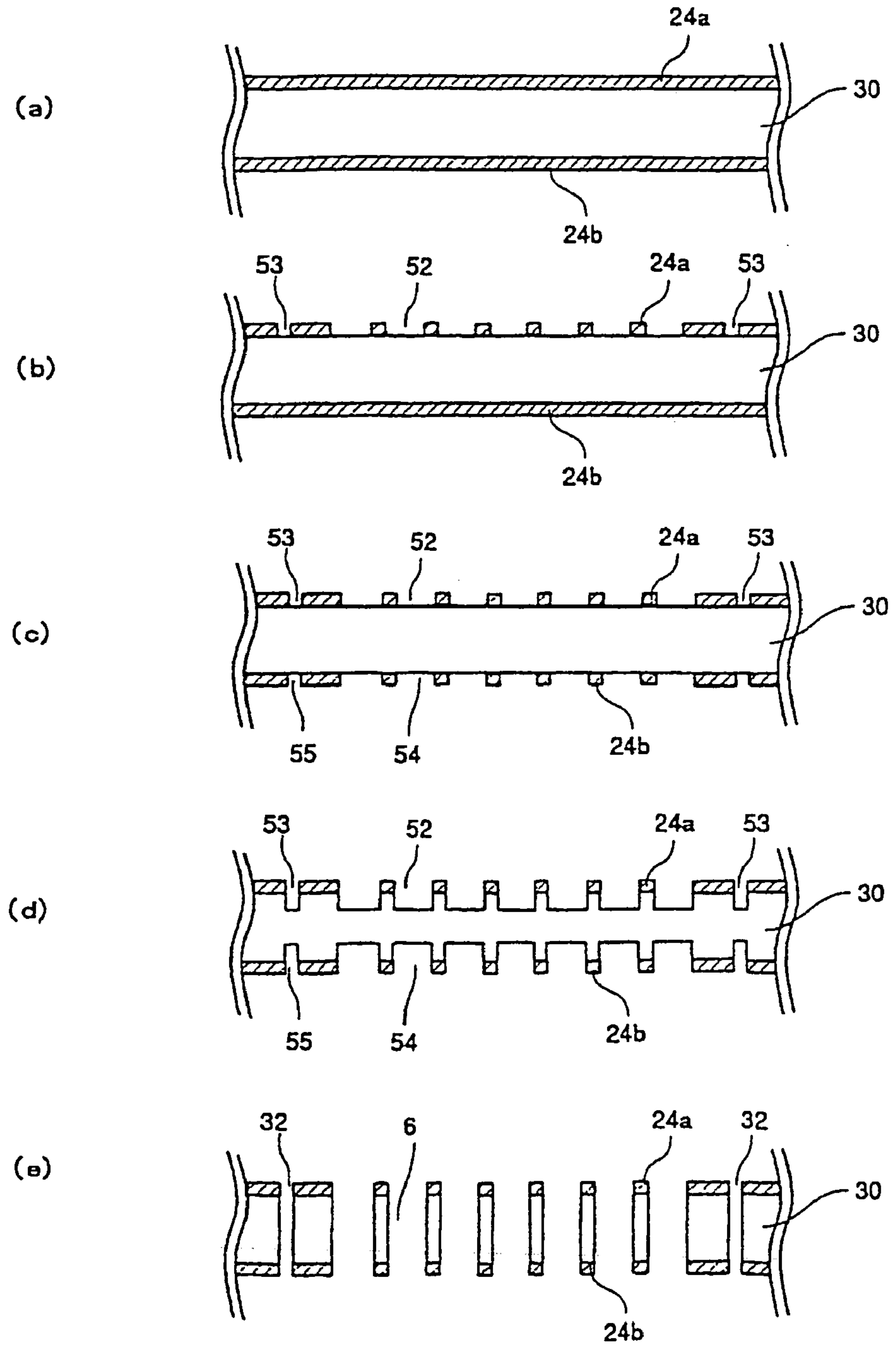
FIG. 18 is a diagram for explaining the sixth preferred embodiment of the manufacture method of the liquid drop discharge head of the present invention.

As shown in FIG. 18 (*a*), the silicon nitride as etching-proof layers 24*a* and 24*b* is formed to both sides of the silicon wafer 30 of (110) crystalline orientation.

As shown in FIG. 18 (*b*), the patterning of the etching-proof layer 24*a* on top is carried out by the photolithography method and dry etching at the form of the liquid-chamber pattern 52, the common liquid-chamber pattern, and an etching separation line pattern 53.

As shown in FIG. 18 (*c*), the patterning of the etching-proof layer 24*b* at the bottom is carried out similarly at the form of the liquid-chamber pattern 5fourthe common liquid-chamber pattern, and an etching separation line pattern 55.

IR alignment is performed in order to double the pattern and the position on top at this time.

Then, anisotropic etching is performed at the temperature of 80 degrees C. potassium hydroxide aqueous solution 35 wt %.

At this time, since the silicon wafer of (110) crystalline orientation is used as shown in FIG. 18 (*d*), the dig lump is formed in the perpendicular.

If etching is furthermore continued, the wafer will be penetrated, and as shown in FIG. 18 (*e*), the liquid-chamber 6, common liquid-chamber, and etching separation line 32 will be formed.

Thus, by forming the pattern of an etching separation line with the liquid chamber and the common liquid chamber, and performing etching simultaneously, simultaneously with the formation of the liquid chamber and the common liquid chamber, an etching separation line can also be formed simultaneously, can be produced without the special process for the formation of an etching separation line, and can reduce cost.

In the present embodiment, although the cross section is perpendicular, straight line precision is good and the dicing is raised as an example as the separation method with the sufficient position precision, the blast cleaning, the wire saw, the water jet, etc. can be used as the separation method which fulfills all or a part of the advantage.

Moreover, also in that anisotropic etching can form the thin groove with the sufficient precision although anisotropic etching is made into an example as a method of forming the separation line in the part within the wafer side alternatively, although it is suitable, as a method of forming the separation line alternatively, the method of the water laser which lets laser pass can also use the inside of isotropic etching, the blast cleaning, chopper dicing, laser processing, and the water column.

Figure 20:
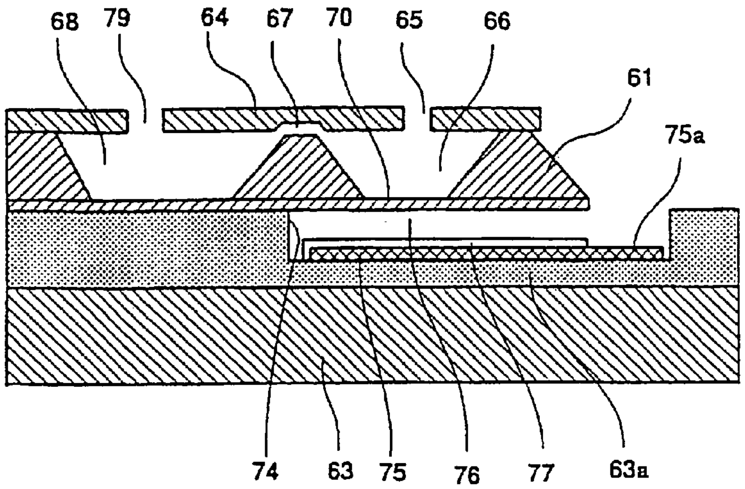
FIG. 20 is a sectional view of the ink-jet head of the second preferred embodiment taken along the line parallel to the longitudinal direction of the diaphragm.
Figure 21:
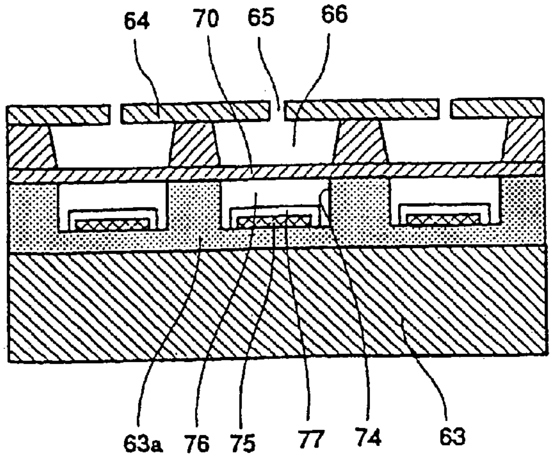
FIG. 21 is a sectional view of the ink-jet head of the second preferred embodiment taken along the line parallel to the lateral direction of the diaphragm.

Next, the second preferred embodiment of the ink-jet head as a liquid drop discharge head of the present invention is explained with reference to FIG. 19 through FIG. 21.

Figure 19:
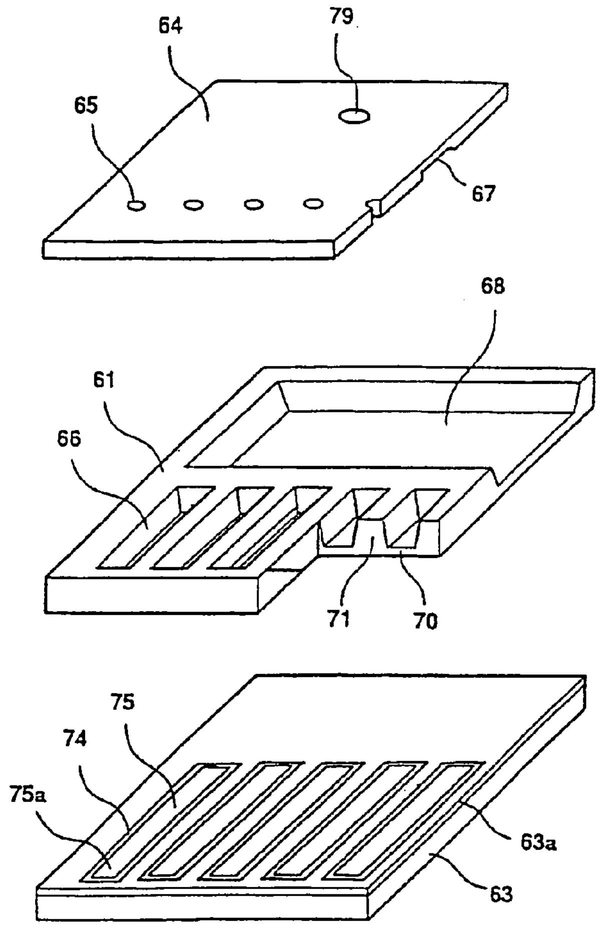
FIG. 19 is a perspective exploded view of the ink-jet head of the second preferred embodiment of the liquid drop discharge head of the present invention.

FIG. 19 is a perspective exploded view of the ink-jet head of the present embodiment. FIG. 20 is a sectional view of the ink-jet head of the present embodiment taken along the line parallel to the longitudinal direction of the diaphragm. FIG. 21 is a sectional view of the ink-jet head of the present embodiment taken along the line parallel to the lateral direction of the diaphragm.

The ink-jet head of the present embodiment includes the liquid-chamber formation member (which is the first substrate) which is provided as the passage substrate 61.

It is the laminating structure which is bonded in piles the electrode substrate 63 which is the member, and the nozzle plate 64 which is the third substrate prepared in the passage substrate 61 bottom. The electrode formation which is the second substrate prepared on the bottom of the passage substrate 61.

The liquid chamber 66 which is also the ink passage which two or more nozzles 65 open for free passage, the common liquid chamber 68 which is open for free passage through the fluid resistance section 67 to the liquid chamber 66 are formed.

The concavity which forms the diaphragm 70 which forms the surface of a wall used as the liquid chamber 66 and the bottom of this liquid chamber 66, and the partition wall 71 which separates each liquid chamber 6 six the concavity which forms the common liquid chamber 78 are formed in the passage substrate 61.

In the passage substrate 71, boron is diffused as the high concentration impurity in the thickness (depth) direction of the single-crystal-silicon substrate (silicon wafer) of (100) crystalline orientation with the diaphragm, and by performing anisotropic etching by using the high-concentration boron doped layer as the etching stop layer, when forming the concavity used as the liquid chamber 66, and the diaphragm 70 of a desired thickness is obtained.

Apart from the above-mentioned boron, gallium, aluminum, etc. can be used as the high-concentration p-type impurity.

Moreover, by including germanium with a lattice constant larger than that of silicon, in the high concentration boron doped layer in addition to the boron, it can be based on the boron, and the tensile stress can be reduced.

Moreover, it is also possible to use the silicon-on-insulator (S OI) substrate which bonds the base substrate and the active-layer substrate together through the oxide film as the passage substrate 71.

In this case, the concavity which becomes the base substrate with the liquid chamber 66 or the common liquid chamber 68 is carved, using the active-layer substrate as the diaphragm 70.

In the electrode substrate 63, the concavity 74 is formed, the electrode 75 which puts the predetermined air gap 76 on the diaphragm 70, and counters it is formed in the bottom of the concavity 74, and the actuator section to which the diaphragm 70 is changed into by electrostatic force, and the contents product of the liquid chamber 66 is changed by the electrode 75 and the diaphragm 70 is constituted.

In order to prevent that the electrode 75 be damaged by contact to the diaphragm 70 on the electrode 75 of the electrode substrate 73, the insulated layers 77 of 0.1-micrometer thickness, such as $SiO_2$, are formed.

The electrode pad section 75*a* for installing the electrode 75 to near the end of the electrode substrate 73, and connecting through the external drive circuit and the connection means is formed.

The electrode substrate 63 forms the electrode 75 only in the concavity 74 by forming the concavity 74 by etching in HF aqueous solution etc. on the glass substrate or the single-crystal-silicon substrate in which thermal oxidation film 63*a* is formed on the surface, forming membranes in the thickness of the request of the electrode material which has high heat-resisting properties, such as titanium nitride, in the concavity 74 with membrane formation technology, such as the sputter, CVD, and the vacuum evaporation, forming the photo-resist after that and etching.

The electrode substrate 63 and the passage substrate 61 are bonded in the processes, such as anode plate bonding and direct bonding.

The polycrystalline silicon film which doped the refractory metals, such as the metallic materials, such as two-layer structure of for example, the tungsten side film and the poly silicon film or the gold, and aluminum, Cr, nickel that are generally usually used in the formation process of the semiconductor device, and Ti, TiN, and the impurity can be used for the electrode 75.

In the concavity 74 with a depth of 0.4 micrometers formed in the silicon substrate by etching, the electrode 75 carries out the sputter of the titanium nitride to the thickness of 0.1 micrometers, forms it, and forms the $SiO_2$ sputter film as an insulated layer 77 by 0.1-micrometer thickness on it in this example.

Therefore, in this head, the length (interval of the diaphragm 70 and the insulated layer 77 surface) of the air gap 76 after bonding the electrode substrate 63 and the passage substrate 61 is 0.2 micrometers.

Moreover, the ink feed outlet 79 for supplying the ink to the nozzle 6fifthe groove used as the liquid resistance section 67, and the common liquid chamber 68 from the exterior is formed in the nozzle plate 64, and it has given a water-repellent finish in the discharge side.

As this nozzle plate 66 is of the double layer structure of the metal layers, such as metals, such as the metal-plating film manufactured by the nickel electrocasting method, the silicon substrate, and SUS, the resin, and zirconia, etc. can be used.

The nozzle plate 64 is bonded to the passage substrate 61 by adhesive. Thus, the ink-jet head is produced in the above manner.

By using the diaphragm 70 as the common electrode and impressing the driver voltage between the diaphragm 70 and the electrode 75 alternatively from the driver IC (drive circuit) by using the electrode 75 as the individual electrode The diaphragm 70 carries out deformation and displacement of the diaphragm 70 by the electrostatic force generated between the diaphragm 70 and the electrode 75 at the electrode 75 side, and the diaphragm 70 carries out the return deformation by what is made for the charge between the diaphragm 70 and the electrode 75 to discharge from this state (the driver voltage is set to 0).

The contents product (volume)/pressure of the liquid chamber 66 changes, and the ink drop is discharged out from the nozzle 65.

Next, the ink-jet head of the third preferred embodiment of the liquid drop discharge head of the present invention is explained with reference to FIG. 22 and FIG. 23.

Figure 22:
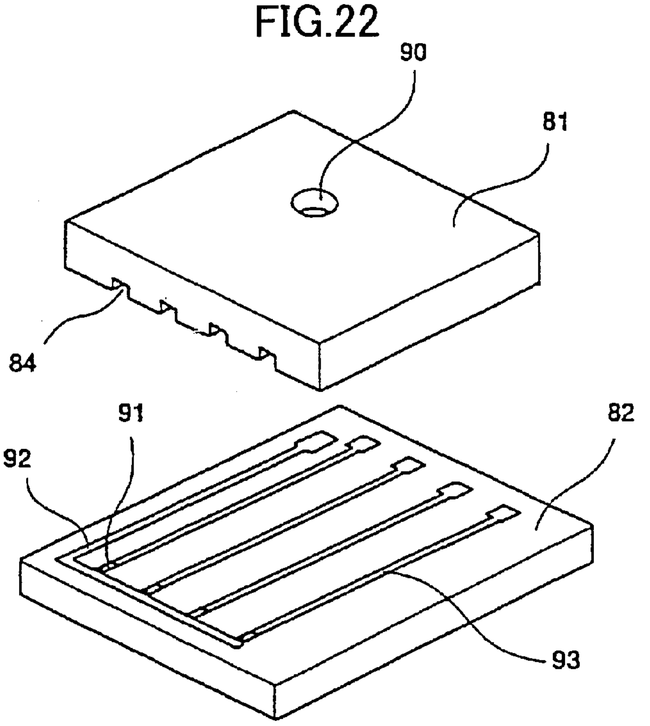
FIG. 22 is a perspective view of the ink-jet head which is the third preferred embodiment of the liquid drop discharge head of the present invention.
Figure 23:
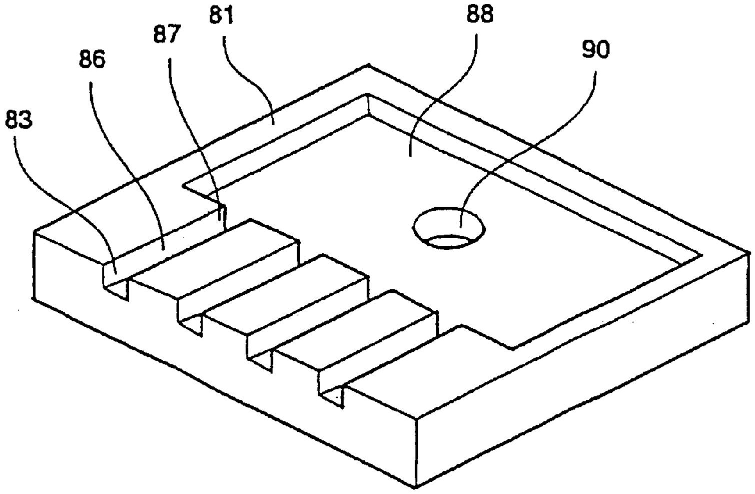
FIG. 23 is a perspective view of the passage formation substrate of the ink-jet head of the third preferred embodiment.

FIG. 22 shows the ink-jet head which is the third preferred embodiment of the liquid drop discharge head of the invention. FIG. 23 shows the passage formation substrate of the ink-jet head of the present embodiment.

The ink-jet head of the present embodiment includes the first substrate 81 which is the passage formation member (liquid-chamber formation member), and the second substrate 82 which is the heating element substrate provided on the first substrate 81 bottom.

The common liquid-chamber passage 88 which supplies the ink to the pressurized liquid-chamber passage 86 which is the liquid passage which communicates with each of the nozzles 84 to discharge the ink drop, and the pressurized liquid-chamber passage 86 are formed.

The ink is supplied from the ink feed outlet 90 of the first substrate 81, and is injected as a drop from the nozzle 84 through the common liquid-chamber passage 88 and the pressurized liquid-chamber passage 86.

The first substrate 81 which is the passage formation member forms the nozzle 84, the pressurized liquid-chamber passage 86, and the common liquid-chamber passage 88 on the silicon wafer for each chip unit, and separates these component chips by the dicing and etching.

The common electrode 92 and the individual electrodes 93 for applying the drive voltage at the exothermic resistor (electric thermal-conversion element) 91 and the exothermic resistor 91 are formed in the second substrate 82.

Thus, in the ink-jet head of the present embodiment, by applying the drive voltage to the individual electrode 93 alternatively, the exothermic resistor 91 generates heat, the bubble occurs, the pressure change occurs and the ink drop is discharged out from the nozzle 84 by using the ink of the pressurized liquid-chamber passage 86 by the pressure change.

Figure 24:
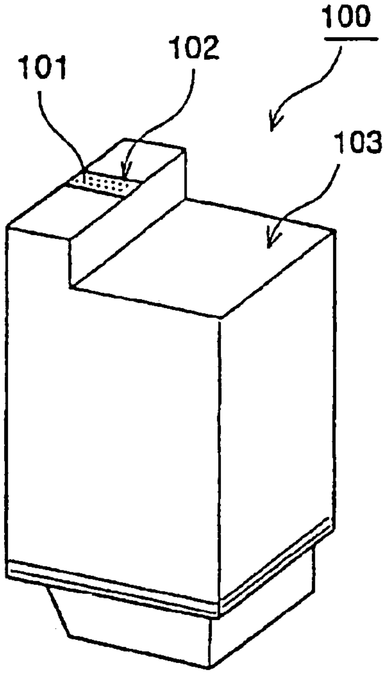
FIG. 24 is a perspective view of the ink cartridge of the present invention.

Next, the ink cartridge of the present invention is explained with reference to FIG. 24. FIG. 24 shows the ink cartridge —according to the present invention.

In the ink cartridge 100 of FIG. 24, the ink tank 103 which supplies the ink to the ink-jet head 102, and the ink-jet head 102 of the present which has the nozzle 101 for discharging the ink drop are formed integrally.

Thus, the yield defect of the ink-jet head causes the defect of the whole ink cartridge immediately in the case of the present embodiment. According to the present embodiment, it is possible that the poor ink drop discharge by the remains of chippings decreases, and the yield of the ink cartridge improves, and low-cost manufacture of the ink cartridge can be attained.

Next, an example of the ink-jet printing device which carried the ink-jet head which is the liquid drop discharge head of the present invention is explained with reference to FIG. 25 and FIG. 26.

Figure 25:
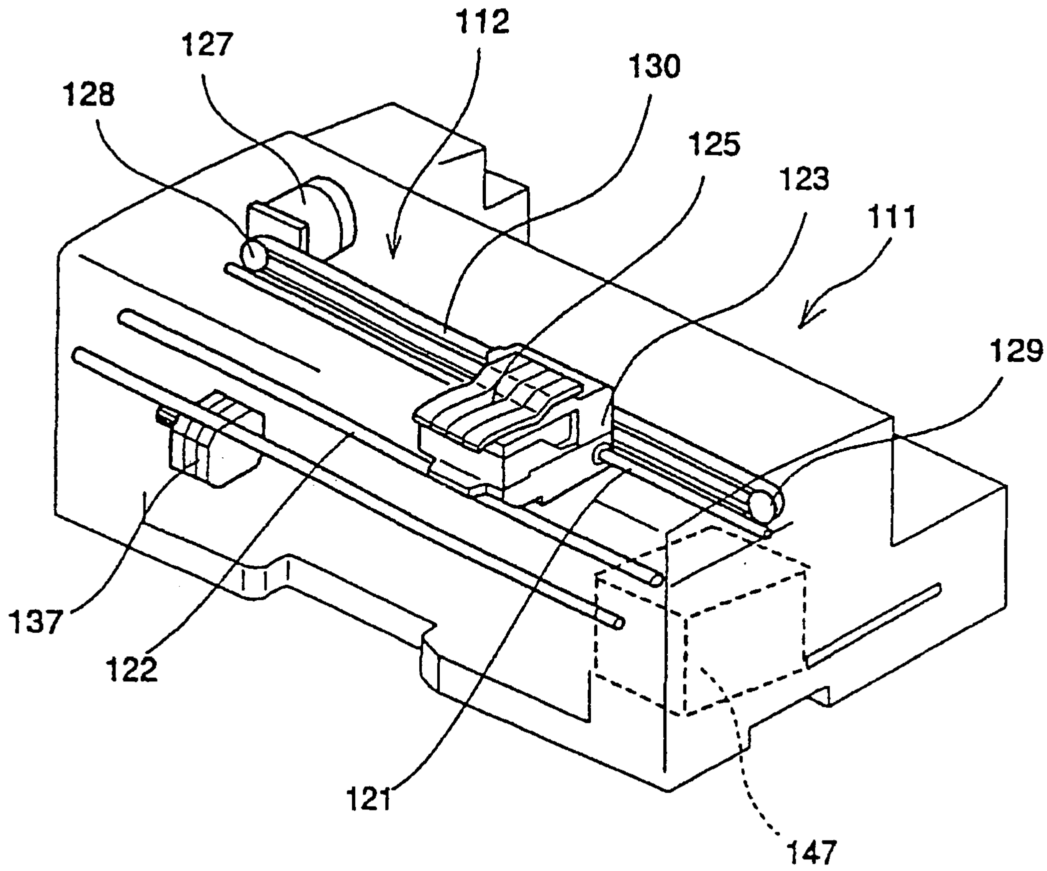
FIG. 25 is a perspective view of the mechanism section of the ink-jet printing device of the present invention.
Figure 26:
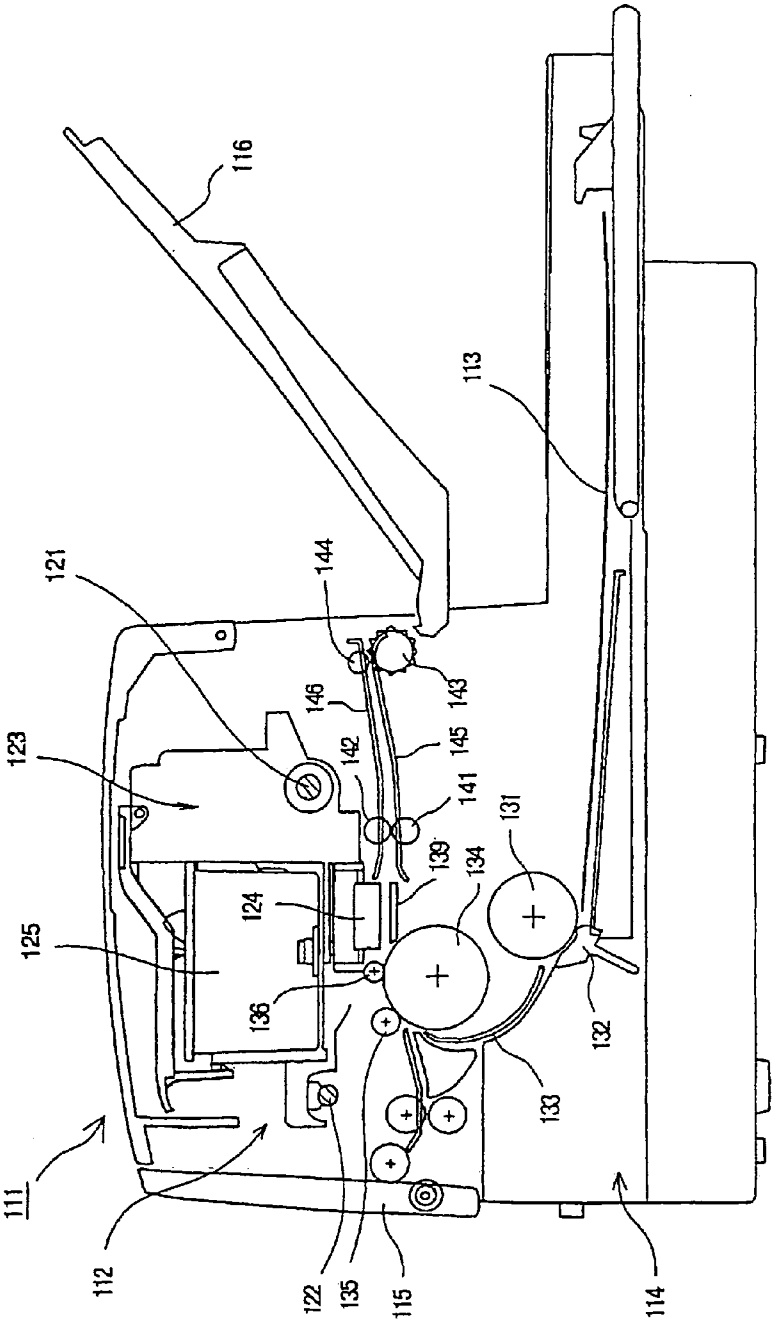
FIG. 26 is a sectional view of the ink-jet printing device of the present invention.

FIG. 25 is a perspective view of the mechanism section of the ink-jet printing device of the present embodiment. FIG. 26 is a sectional view of the mechanism section of the ink-jet printing device.

The ink-jet printing device of the present embodiment includes the main part 111 in which the printing mechanism section 112 is provided. In the printing mechanism section 112, the ink cartridge which supplies the ink to the ink-jet head, the carriage which is movable in the direction of the main scanning, the printing head which is constituted by the ink-jet head of the invention and provided on the carriage are provided.

In the lower portion of the main part 111, the feed cassette (or the paper tray) 114 which can load several copy sheets 113 therein is freely inserted into or extracted from the front side. The manual feed tray 115 is rotatably attached to the front side, and the copy sheet 113 may be manually supplied to the printing head by using the manual feed tray 115.

When the copy sheet 113 is placed on the feed cassette 114 or the manual feed tray 115, it is fed from the tray 114 or 115 to the printing mechanism section 112 so that the image printing is performed on the copy sheet 113 by the printing mechanism section 112. After this, the copy sheet is delivered to the delivery tray 116 which is provided at the rear side surface of the printing device 111.

The main guide rod 121 and the follower guide rod 122 are provided as the guide members in the printing mechanism section 112 horizontally across the right and left side plates. The carriage 123 is retained by the guide members 121 and 122 in the direction of the main scanning (the perpendicular direction of FIG. 26).

The head 124 provided on the carriage 123 includes the ink-jet heads according to the liquid drop discharge head of the present invention, and the ink-jet heads discharge the yellow (Y), the cyan (C), the magenta (M) and the black (Bk) ink drops, respectively. The ink discharge nozzles for the respective color inks are arranged in the direction which intersects the direction of the main scanning, and the direction of the ink drop discharge is turned to the downward direction.

Moreover, the carriage 123 is equipped with the respective ink cartridges 125 for supplying the ink of each color to the head 124. Each ink cartridge 125 is installed such that the exchange of the ink cartridge 125 with new one is possible.

Each ink cartridge 125 includes the atmosphere inlet at its upper portion which communicates with the atmosphere, the ink supply outlet at its upper portion which supplies the ink to the ink-jet head, and the porosity object inside with which the ink is filled.

Moreover, the head 124 having the ink-jet heads of the four colors is used as the printing head in the present embodiment, but a single head which has the nozzles which discharge the ink drops of the respective colors may be used instead.

The carriage 123 is slidably mounted on the back side (the copy sheet conveyance direction downstream side) of the main guide rod 121 located at the rear side portion, and is slidably mounted on the back side (the copy sheet conveyance direction upstream side) of the follower guide rod 122 located at the front side portion.

In order to carry out the transfer scanning of the carriage 123 in the direction of the main scanning, the timing belt 130 is provided between the drive pulleys 128 and the follower pulleys 129 by which the rotation drive is carried out by the scanning motor 127. The timing belt 130 is fixed to the carriage 123, and the both-way drive of the carriage 123 is carried out by the right reverse rotation of the scanning motor 127.

On the other hand in order to convey the copy sheet 113 contained in the feed cassette 114 to the lower part side of the head 124, the feed roller 131 and the friction pad 132 which carry out separation and feeding of the copy sheet 113 from the feed cassette 114, the guide member 133 which guides the conveyance of the copy sheet 113, the conveyance roller 134 which is reversed and supplies the copy sheet 113, and the front-end roller 136 which specifies the sending angle of the copy sheet 113 from the conveyance roller 135 and the conveyance roller 134 are provided.

The rotation driving of the conveyance roller 134 is carried out through the gear sequence by the feed motor 137.

The printing receptacle member 139 is provided at the location corresponding to the successive range of the direction of the main scanning of the carriage 123. The printing receptacle member 139 is the copy sheet guide member by which the copy sheet 113 is sent out from the conveyance roller 134 and retained by the lower part side of the recording head 124.

The delivery roller 143 and the spur roller 144 which are associated with the conveyance roller 141 and the spur roller 142 by which the rotation drive is carried out are provided in the copy sheet conveyance direction on the downstream side of the printing receptacle member 139 in order to send out the copy sheet 113 in the delivery direction. And, in order to send out the copy sheet 113 to the delivery tray 116, the guide members 145 and 146 which form the delivery path of the copy sheet are arranged.

At the time of printing, the carriage 123 is moved by driving the recording head 124 according to the image signal, the ink is discharged out to the copy sheet form 113 at the printing position, and one line of the image is recorded on it, and the following line is recorded on the copy sheet 113 after a predetermined quantity conveyance is performed.

By receiving the print end signal or the signal with which the back end of the copy sheet 113 arrives at the printing range, the printing operation is terminated and the copy sheet 113 is ejected.

In this case, since the controllability of the ink-jet head of the present invention which constitutes the head 124 of ink drop injection improves and the property fluctuation is inhibited, it is stabilized and the picture of high picture quality can be recorded.

Moreover, in the position which separated from the record range by the side of the transfer orientation right end of carriage 123, the collecting device 147 for recovering the poor discharge of the head 124 is configured.

The collecting device 147 has the cap means, the suction means, and the cleaning means.

During printing standby, it transfers at the collecting device 147 side, and capping of the carriage 123 is carried out in the head 124 with the capping means, and it prevents the poor discharge by ink dryness by maintaining the delivery section at the humid state.

Moreover, by carrying out the discharge of the ink which is not related to printing during the printing operation, the ink viscosity of all the nozzles is fixed and the stable discharging performance is maintained.

When the poor discharge occurs, the delivery (nozzle) of the head 124 is sealed with the capping means, air bubbles etc. are sucked out of the delivery with the ink with the suction means through the inner tube, the ink, the dust, etc. adhering to the delivery side are removed by the cleaning means, and the poor discharge is recovered.

Moreover, the attracted ink is collected to the used ink reservoir (not shown) which is installed in the lower portion of the main part, and absorption retention is carried out with the ink absorber of the used-ink reservoir.

Thus, since the ink-jet head of the low cost which carried out the present invention in this ink-jet printing device is carried, low-cost manufacturing can be attained.

Next, the seventh preferred embodiment of the manufacture method of the liquid drop discharge head of the present invention is explained with reference to FIG. 28 and FIG. 29.

Figure 28:
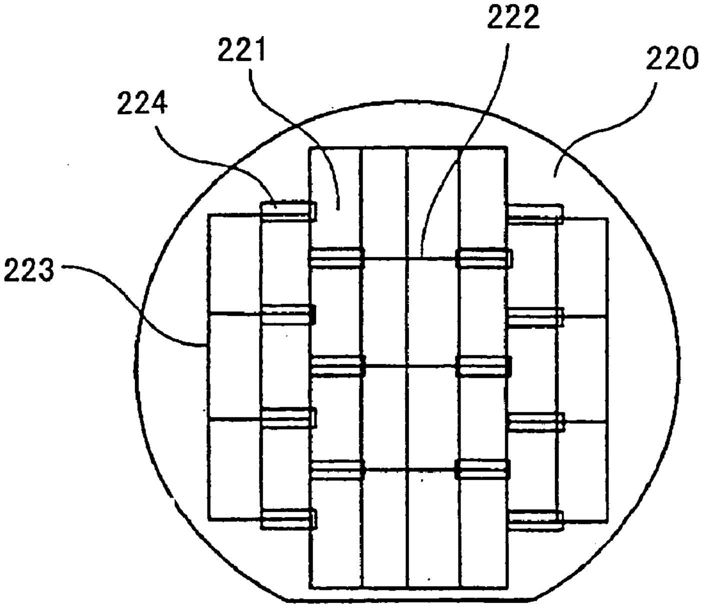
FIG. 28 is a diagram showing the chip arrangement on the wafer in order to explain the seventh preferred embodiment of the manufacture method of the liquid drop discharge head of the present invention.

FIG. 28 shows the chip arrangement on the silicon wafer 220 in order to explain the seventh preferred embodiment of the manufacture method of the liquid drop discharge head of the invention. FIG. 29 is a diagram for explaining the separation of the strip-like chips from the silicon wafer 220.

The present embodiment is provided as an example in the case where the silicon wafer 220 of (100) crystalline orientation is used.

In FIG. 28, it is configured so that two or more strip-like chips 221 by separating into the silicon wafer 220 in the position of the lateral separation line 222 and the lengthwise separation line 223 may be obtained.

In this case, it is considering as the layout which the chip of the at least 1 sequence (it is the right-and-left 2 sequence in FIG.) of one separation line (lengthwise separation line 223) and the sequence of the parallel chip 221 shifts to the sequence of other chips in parallel with the separation line (lateral separation line 222) of another side and by which it is configured.

In the present embodiment, the slit 224 which penetrates the silicon wafer 220 by laser etc. on a part of separation line 222 of the longitudinal orientation of the silicon wafer 220 is formed.

In addition, the separation line 222 and the slit 224 that are overlapped are illustrated FIG. 28, and it is for the purpose of clarifying the position of the slit 224.

Figure 29:
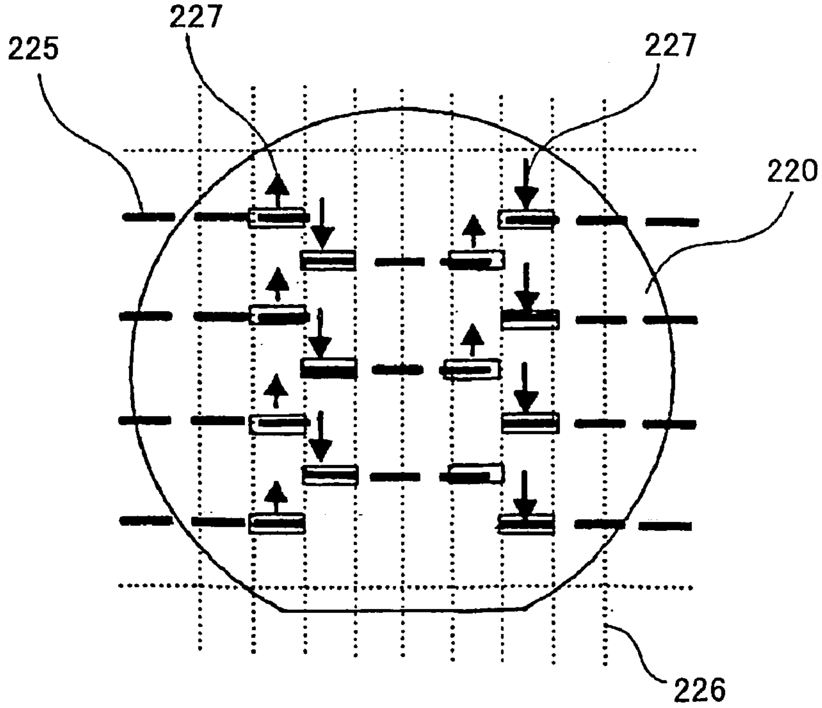
FIG. 29 is a diagram for explaining the chip separation of the wafer of FIG. 28.

As shown in FIG. 29, chopper dicing separates by the dicing separation line 225 (thick line) corresponding to the lateral separation line 222, and the dicing separates the silicon wafer 220 by the dicing separation line 226 (dotted line) corresponding to the lengthwise separation line 23.

Since chopper dicing can go up and drop the dicing blade in the arbitrary places on the wafer, along with the dicing separation line 22fifthe dicing of it can be carried out by raising the dicing blade to FIG. 29 in the position of the slit 224, as the arrow 227 shows, and dropping it.

Also in the logging layout which the chip of the at least 1 sequence of the sequence of the separation line and the parallel chip shifts to the separation line and the parallel orientation and by which according to the present embodiment while showed in FIG. 28, and it is configured to the sequence of other chips at them Since it has separated lengthwise by the dicing as shown in FIG. 29 the precision of the edge of the chip can be good, the precision at the time of carrying out positioning to other parts which contact the chip can become good, the chip can take, and the number can be increased.

Moreover, since the cross section does not become tapered but is perpendicular, there is little cracking when positioning.

Furthermore, since the longitudinal orientation is separated by the slit and chopper dicing by laser, the degree of freedom of the array of the chip becomes large, and many chips can be produced rather than the conventional array shown in FIG. 27.

Next, the form of the slit 224 formed on the separation line is explained with reference to FIG. 30 through FIG. 35.

Figure 30:
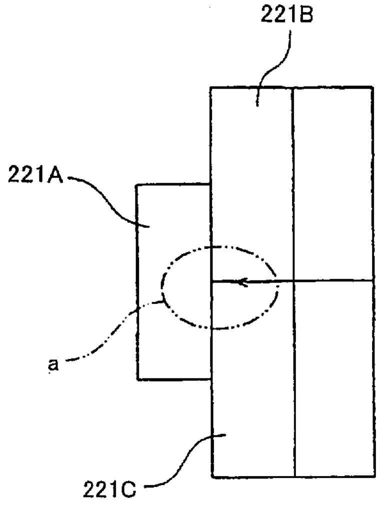
FIG. 30 is a diagram showing the chip arrangement on the wafer in the state before forming the slit.

FIG. 30 shows the layout of the chip separation pattern (the cutting pattern) in which the configuration is shifted in the direction along the separation line of FIG. 28 in the state before forming the slit.

Generally, in the dicing, the circular dicing blade with the diamond abrasive grains is used.

Figure 31:
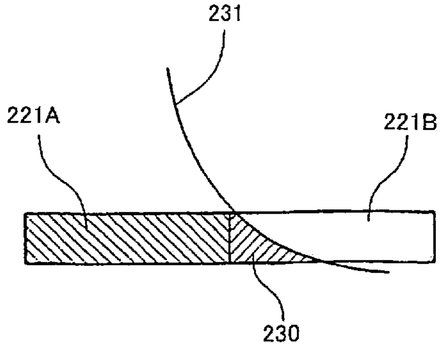
FIG. 31 is a sectional view of the wafer for explaining the problem when performing the chip separation in the state of FIG. 30.

The slit 224 is not formed as shown in FIG. 30 in the case of dicing of the wafer with the chip layout of FIG. 28 using the circular blade. FIG. 31 is an enlarged sectional view of the wafer for explaining the problem when performing the chip separation in the layout of FIG. 30.

The portion 230 which is indicated by the shading lines in FIG. 31 is not separated completely by the dicing blade 231 and will remain on the chip 221A.

When the dicing tends to separate the portion 230 completely, the blade 231 will enter even the range of the chip 221A, and the chip 221A will be kept as a poor chip depending on the case.

The end surface of the chip does not serve as the straight line when the edge of the chip tends to be contacted to carry out alignment, and the precision becomes poor if the cleavage tends to separate the portion 230 (the shaded lines) into the chips 221B and 221C behind.

Figure 32:
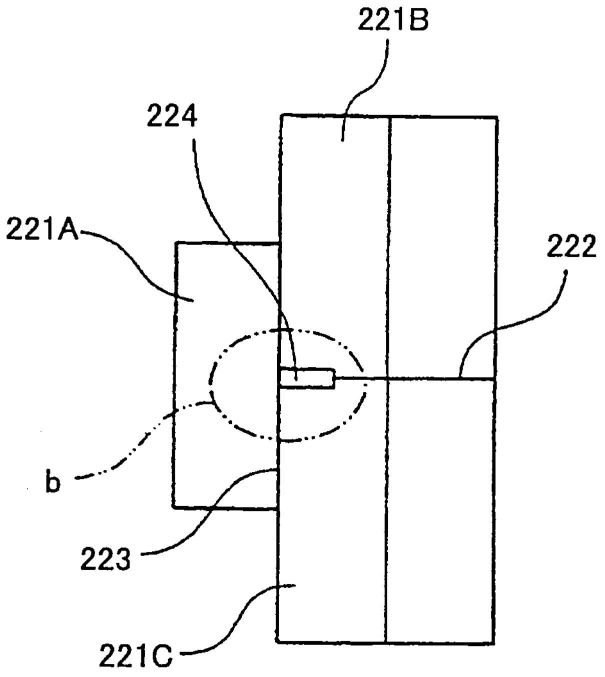
FIG. 32 is a diagram showing the chip arrangement on the wafer in the state after forming the slit.

Therefore, it becomes possible to separate the chips 221B and 221C completely, without making the chip 221A poor, by forming the slit 224 at the T-shaped intersection between the lateral separation line 222 and the lengthwise separation line 223, as shown in FIG. 32.

Figure 33:
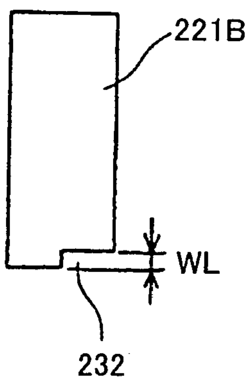
FIG. 33 is a diagram for explaining the state when the chip of the portion in which the slit is formed is separated from the wafer.

When the dicing of the chip 221B of FIG. 32 is carried out and the chip separation occurs, as shown in FIG. 33, the level difference WL arises at the end portion 232 of the chip 221B.

Figure 34:
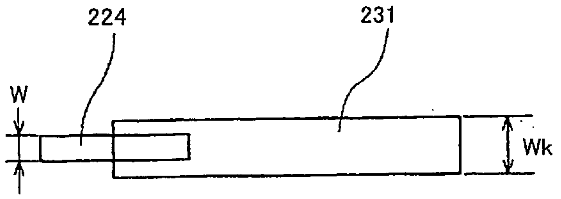
FIG. 34 is a diagram of the chip for explaining the width of the slit.

The level difference WL is produced due to fluctuations by the size variation on the manufacture when forming the slit 224 or the dimensional tolerance of the blade 231, and the width W of the slit 224 and the width Wk of the dicing blade 231 are not necessarily in agreement, as shown in FIG. 34.

When the difference between the width W of the slit 224 and the width Wk of the dicing blade 231 is too large, the level difference WL may differ greatly, and the alignment precision cannot be secured. The defect at the time of assembly may sometimes be caused.

According to the present invention, it is confirmed that if the absolute value of the difference between the width W of the slit 224 and the width Wk of the dicing blade 231 is less than 0.5 mm (or if the level difference WL is 0.5 mm or less), then the alignment precision could be secured and the defect at the time of assembly could be reduced.

Thus, by restricting the level difference WL of the chip's end surface, the chip size after separation is finished uniformly, the chip in which simple positioning is possible is obtained, and the cost at the time of packaging can be reduced.

Next, if the chip 221A tends to be made poor when it is going to separate by the dicing or the cleavage tends to separate as the completely inseparable range is generated if the length L of the slit 224 is too short, the chips 221B and 221C will not serve as the straight line, and the problem that the alignment precision does not improve arises.

Figure 35:
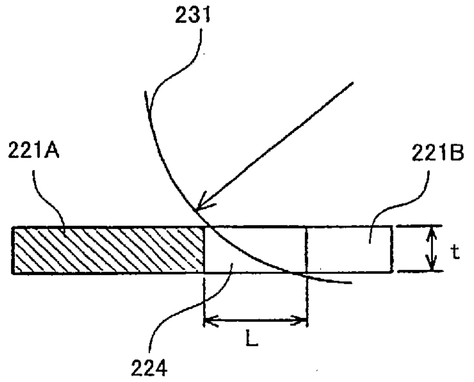
FIG. 35 is a sectional view of the chip for explaining the length of the slit.

Then, as shown in FIG. 35, assuming that r indicates a radius of the dicing blade and t indicates a thickness of the chip, it is desirable that the length L of the slit 224 satisfies the following formula (1).

$$\sqrt{r^2-(r-t)^2} \leqq L \tag{1}$$

Accordingly, if the length L of the slit is restricted according to the formula (1) when performing dicing, the bridge portion does not remain on the chip after separation. Easy and high-precision alignment is possible with the chip arrangement of the present embodiment, and low-cost manufacture can be attained.

Next, the eighth preferred embodiment of the manufacture method of the liquid drop discharge head of the present invention is explained with reference to FIG. 36 and FIG. 37.

Figure 36:
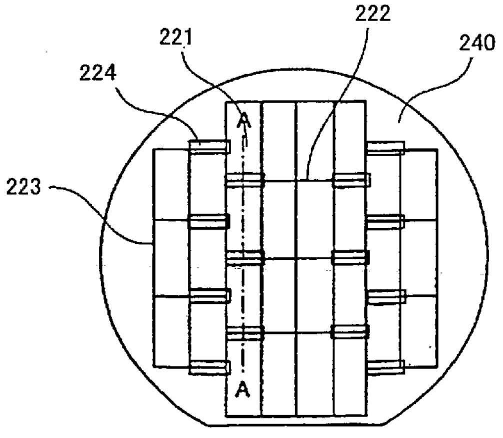
FIG. 36 is a diagram showing the chip arrangement on the wafer in order to explain the eighth preferred embodiment of the manufacture method of the liquid drop discharge head of the present invention.
Figure 37:
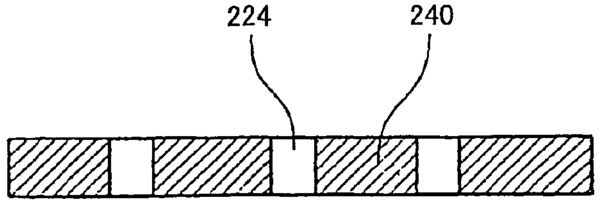
FIG. 37 is a sectional view of the wafer taken along the line A—A indicated in FIG. 36.

FIG. 36 shows the chip arrangement on the wafer in order to explaining the manufacture method of the present embodiment. FIG. 37 is a sectional view of the wafer taken along the line A—A indicated in FIG. 36.

In the present embodiment, the slit 224 is formed in the <112> orientations of the silicon wafer 240 of (110) crystalline orientation by etching using the silicon wafer 240 of (110) crystalline orientation.

In the silicon wafer 240 of (110) crystalline orientation, if the perpendicular (111) to the wafer side is formed by the pattern of the <112> orientations and etching time is lengthened, the slit will be penetrated to the back of the wafer.

Therefore, by forming the slit 224 in the <112> orientations, the width size of the slit 224 by etching can be formed with the sufficient precision, the relation between the width W of the slit and the width Wk of the blade can be managed with the sufficient precision, and the level difference WL can be further managed with the sufficient precision.

In the wafer of (110) crystalline orientation, the etching configuration becomes the parallelogram with the angle of 54.7 degrees, or 70.5 degrees. The hexagon, in a straight line, the slit of the orientation which intersects perpendicularly in the <112> orientations cannot be formed.

Although the small pattern can be put in order and formed when forming the slit in the orientation which intersects perpendicularly in the <112> orientations, the edge of the chip will become saw-like in that case.

Then, since the slit is formed in the <112> orientations in which the straight line is obtained by etching and the dicing separated the orientation perpendicular to the <112> orientations, the edge of the chip is formed with the sufficient precision.

A description will be given of the method of forming the slit 224 in the <112> orientations of the silicon wafer of (110) crystalline orientation with reference to FIG. 38 through FIG. 41.

Figure 38:
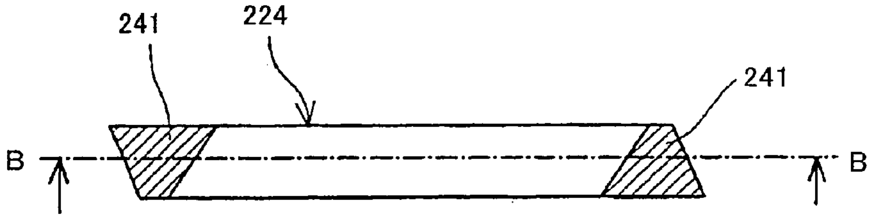
FIG. 38 is a diagram showing the slit portion on the wafer in order to explain the ninth preferred embodiment of the manufacture method of the liquid drop discharge head of the present invention.
Figure 39:
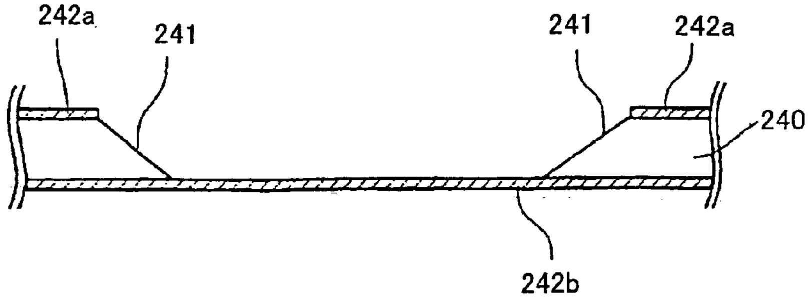
FIG. 39 is a sectional view of the wafer taken along the line B—B indicated in FIG. 38 when carrying out the slit formation by etching from one side of the wafer.
Figure 40:
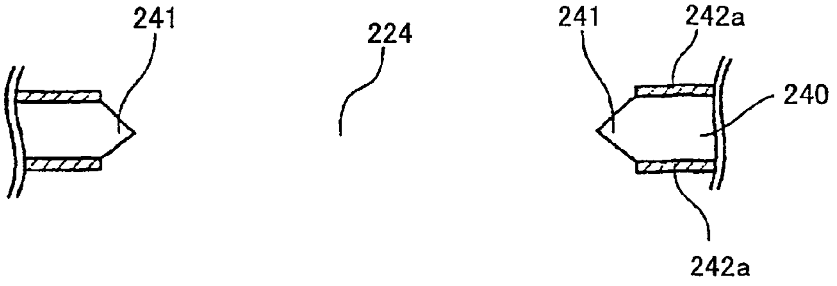
FIG. 40 is a sectional view of the wafer taken along the line B—B indicated in FIG. 38 when carrying put the slit formation by etching from both sides of the wafer.
Figure 41:
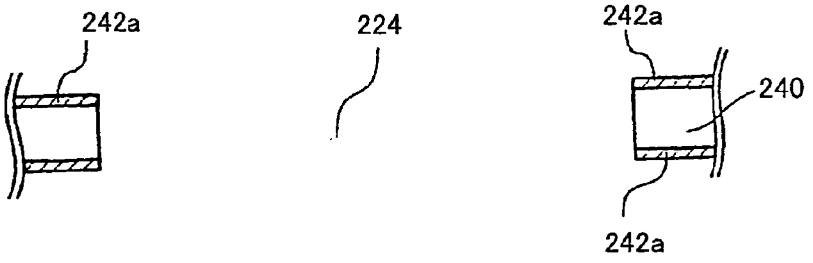
FIG. 41 is a sectional view of the wafer for explaining the formation method of the slit.

FIG. 38 shows the slit portion on the wafer in order to explain the manufacture method of the ninth preferred embodiment of the present invention. FIG. 39 is a sectional view of the wafer taken along the line B—B indicated in FIG. 38 when carrying out the slit formation by etching from one side of the wafer. FIG. 40 is a sectional view of the wafer taken along the line B—B indicated in FIG. 38 when carrying out the slit formation by etching from both sides of the wafer. FIG. 41 is a sectional view of the wafer for explaining the formation method of the slit.

As shown in FIG. 38 and FIG. 39, when etching-proof layer 242*b* is formed in the whole surface for etching-proof layer 242*a* which has the opening for the slits on the whole surface of the silicon wafer 240 of (110) crystalline orientation on the other hand and the slit 224 is formed by etching from one side of the wafer, the taper section 241 is formed on the right and left sides.

Then, as shown in FIG. 40, the depth dug deep by carrying out the patterning of the etching-proof layer 242*a* which has the opening for the slits, performing etching to both sides of the wafer 240 from both sides, and forming the slit 224 in them until it penetrates the wafer 240 becomes good in the half of etching from one side, therefore the length of the taper section 241 becomes half.

Furthermore, if etching is continued after colliding with the taper section 241 from the both sides, etching of the taper section 241 can progress, and as shown in FIG. 41, finally the taper section 241 can also be lost completely. It becomes without damaging the taper remains at the result and the subsequent processes, and the particles are not produced.

Next, the tenth preferred embodiment of the manufacture method of the liquid drop discharge head of the present invention is explained with reference to FIG. 42 and FIG. 43.

Figure 42:
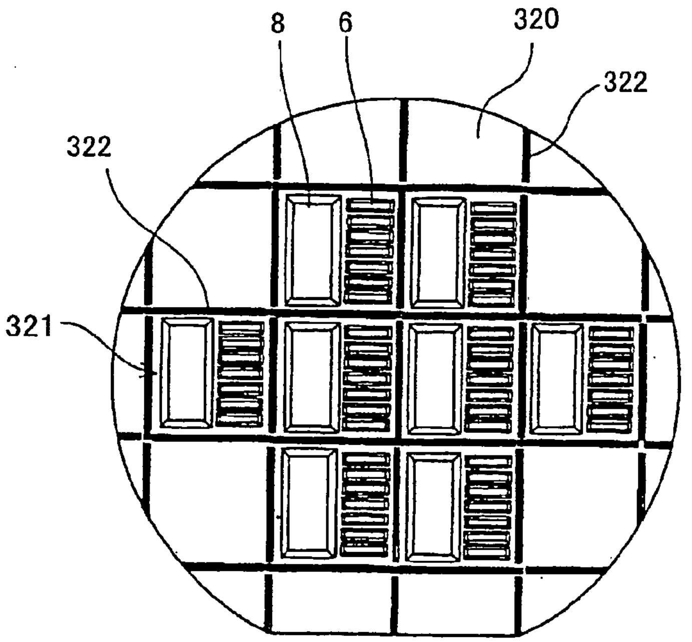
FIG. 42 is a diagram showing the chip arrangement on the wafer in order to explain the tenth preferred embodiment of the manufacture method of the liquid drop discharge head of the present invention.
Figure 43:
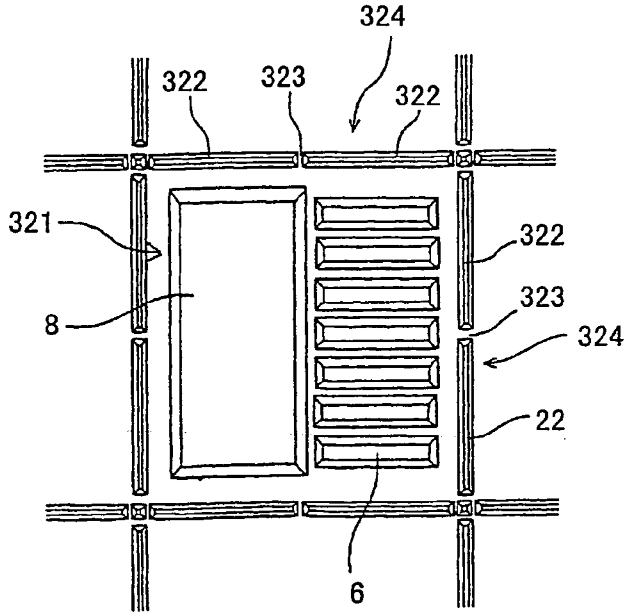
FIG. 43 is an enlarged view of the chip which corresponds to one-chip size of the wafer of FIG. 42.

FIG. 42 shows the chip arrangement on the wafer 320 in order to explain the manufacture method of the present embodiment. FIG. 43 is an enlarged view of the chip corresponding to one-chip size of the wafer 320 of FIG. 42.

In the present embodiment, the chip arrangement is designed for the eight chips (structure) 321 of the passage substrate 1 on the silicon wafer 320. The thin groove 322 is formed between the chips 321.

The thin groove 322 is formed by anisotropic etching at the same time with the forming of the common liquid chamber 8 (or 68) and the liquid chamber 6 (or 66).

In this case, since the high concentration boron diffusion layer is formed in order to form the diaphragm 2 (or 70), as mentioned above, the thin groove 322 did not penetrate the silicon wafer 320, but only the thickness of the diaphragm 2 remains.

Moreover, the thin groove 322 is formed intermittently and the chip 321 is retained by the discontinuous portion (bridge) 323, without coming apart.

In addition, the width of the discontinuous portion 323 is the width for the chip not coming apart with the chip size, the size of the wafer, etc.

The chip separation line 324 consists of putting the pattern and the discontinuous portion 323 of these thin grooves 322 in order.

Therefore, since it is connected between each chip 321 on the thin bridge 323, along with the chip separation line 324, it is separable into each chip 321 by applying slight power.

Although the thin groove 322 leaves a part for the same thickness as the diaphragm 2 and has not penetrated, since the thickness of the portion which remains is very thin, it is easily separable.

Moreover, if the groove width is made still thinner, the groove 322 will not carry out penetration, although it becomes V groove form.

At this time, it is separable with easy power by making small the remainder (=(thickness)−(V groove depth)) of the V groove.

The remaining thickness of the V groove can be adjusted by the groove width.

Moreover, when not making the groove portion stop and penetrate in the V groove, it is not necessary to necessarily use the groove 322 as the intermittence target.

Thus, it is lost by forming the thin groove between each chip, applying stress to the silicon wafer, and separating the chip into it that the chipping adheres at the time of the dicing.

In this case, unlike the fine chipping generated at the time of the dicing, since it is comparatively large, it is removable although the fragment of the bridge may be slightly generated when the chip is separated with washing after chip separation.

Moreover, power, such as water pressure and the vacuum chuck, is not added, either, but since the dicing tape etc. is unnecessary, the yield improves.

Next, the eleventh preferred embodiment of the manufacture method of the liquid drop discharge head of the present invention is explained with reference to FIG. 44 and FIG. 45.

Figure 44:
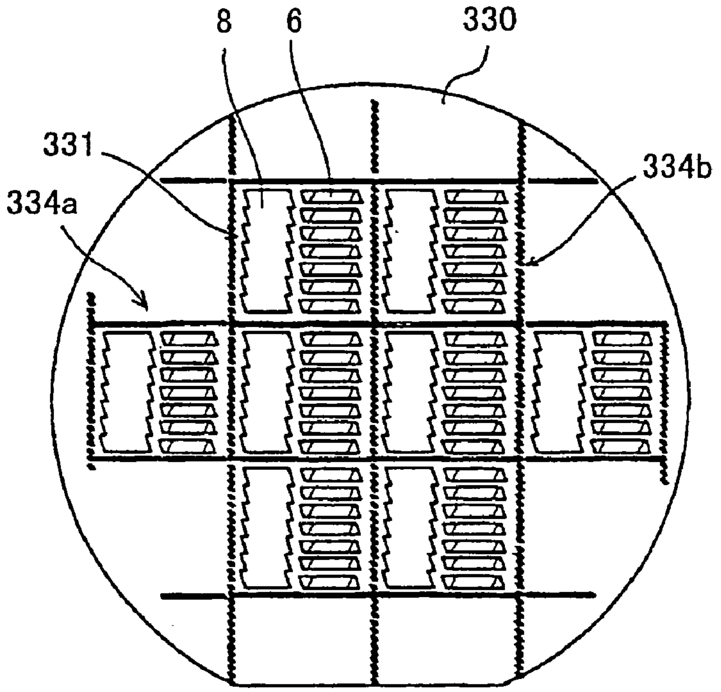
FIG. 44 is a diagram showing the chip arrangement on the wafer in order to explain the eleventh preferred embodiment of the manufacture method of the liquid drop discharge head of the present invention.

FIG. 44 shows the chip arrangement on the wafer 330 in order to explain the manufacture method of the present embodiment. FIG. 45 is an enlarged view of the chip which corresponds to one-chip size of the wafer 330 of FIG. 44.

The passage substrate 1 is formed using the silicon substrate (silicon wafer 30) of (110) crystalline orientation.

Since the substrate of (110) crystalline orientation is used, the common liquid chamber 8 does not meet the parallelogram and the lengthwise direction of the figure does not meet the crystal face in plane form, the liquid chamber 6 is formed in the saw-like shape.

Moreover, in the anisotropic etching of the substrate of (110) crystalline orientation, by carrying out the patterning, the partition wall between the liquid chambers 6 becomes perpendicular, and the liquid chamber 6 can be configured with high density.

Between the chips 331, the plane form forms the grooves 332*a* and 332*b* on the parallelogram (pattern) in the present embodiment.

All over the figure, since the lateral (the <112> orientation) groove 332*a* is the same orientation as the liquid chamber 6, it becomes the long and slender groove in respect of the perpendicular direction (111).

This groove 332*a* and discontinuous partial (bridge) 333*a* between each groove 332*a* constitute chip separation line 334*a*.

On the other hand, since the lengthwise (the <111> orientation) is not in agreement with crystal orientation all over the figure, the groove on vertical cannot be formed.

Then, the groove (pattern) 332*b* of the small parallelogram is put in order and formed, and the chip separation line 334*b* include the grooves 332*b* and discontinuous partial 333*b* between the grooves 332*b*.

In this case, if the pattern of the parallelogram is too small, since the taper of the (111) will enter and etching will stop in V groove, it is necessary to decide the size of groove 332*b* of the parallelogram in consideration of the thickness of the silicon wafer.

Figure 45:
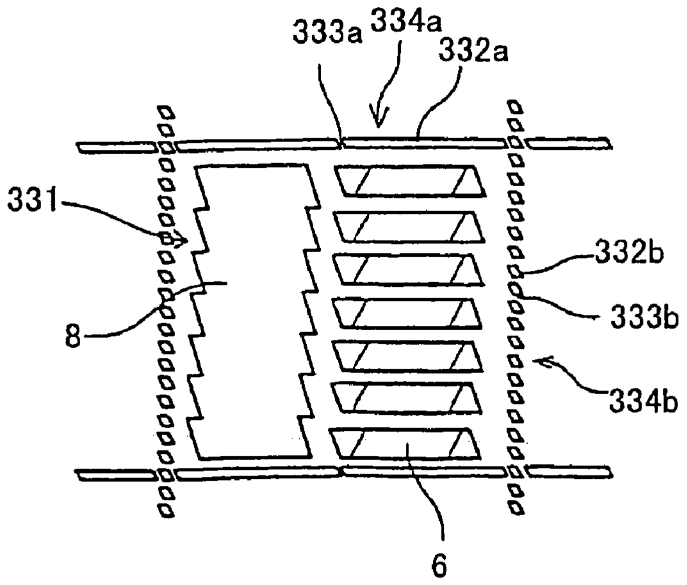
FIG. 45 is an enlarged view of the chip which corresponds to one-chip size of the wafer of FIG. 44.
Figure 46:
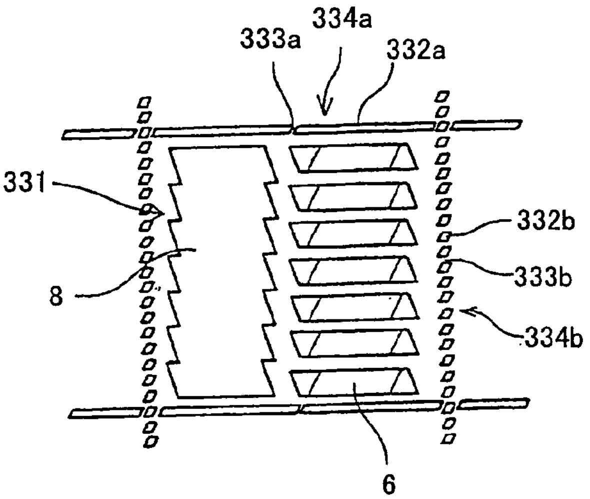
FIG. 46 is an enlarged view of the chip which corresponds to one-chip size of the wafer as a variation of the embodiment of FIG. 44.

In addition, about the form of the grooves 332*a* and 332*b* which constitute the chip separation lines 334*a* and 334*b*, it is not restricted to the example of FIG. 45, and as shown in FIG. 46 the orientation of the parallelogram can also be made into the orientation by the side of opposite, i.e., the parallelogram pattern of the liquid chamber 6 and the parallelogram pattern for the contraries, in FIG. 45.

Figure 47:
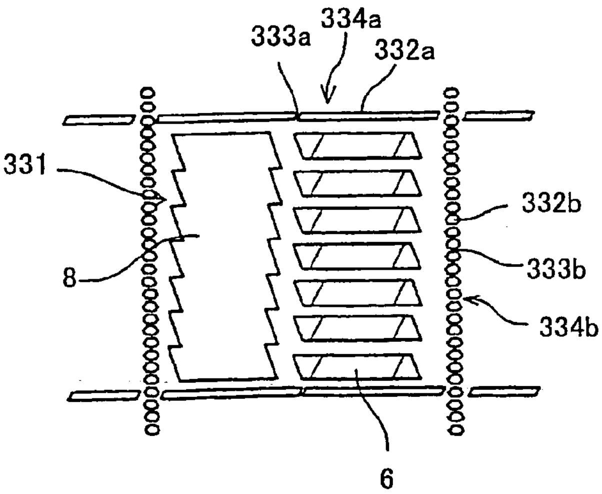
FIG. 47 is an enlarged view of the chip which corresponds to one-chip size of the wafer as a variation of the embodiment of FIG. 44.

As shown in FIG. 47, it can also be made the groove on the hexagon (pattern) not in the parallelogram pattern but in plane form.

The chip in the wafer takes the thinner possible one the chip separation lines 334*a* and 334*b* and the number increases, the width of the separation lines 334*a* and 334*b* has the thinner possible good one.

Figure 48:
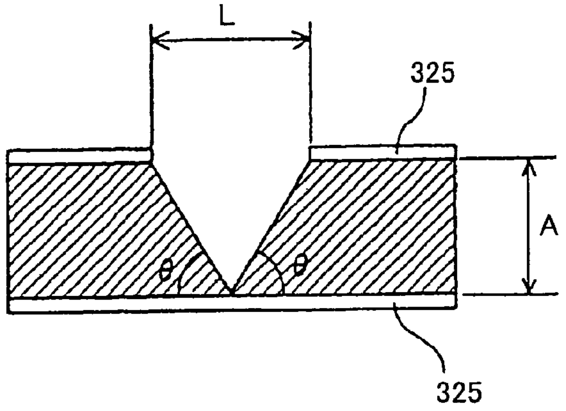
FIG. 48 is a sectional view of the groove in the wafer when using the silicon wafer of (100) crystalline orientation.

When the silicon wafer of (100) crystalline orientation is used at this time, the cross section of the wafer thickness orientation of the groove which constitutes the separation line comes to be shown in FIG. 48.

In addition, the etching mask layer 325 which includes the silicon oxide, the silicon nitride, etc. is formed from both top and bottom sides of the wafer.

In this silicon wafer, the taper of $\theta$=54.7-degree (111) enters by anisotropic etching, and the etching stops in the place where the taper is contacted.

($L=(\sqrt{2})T$) and in order to come out, to be expressed and to make the wafer of thickness A penetrate, the groove width of the relation between depth T dug deep in case the taper is contacted, and the groove width should just be more than $LPLQ=(\sqrt{2})A$.

Moreover, the case where he wants to leave only the slight quantity b, without making it penetrate, the groove width L, $L=\sqrt{2}\,(A-b)$, and it can be kept at high level.

Figure 49:
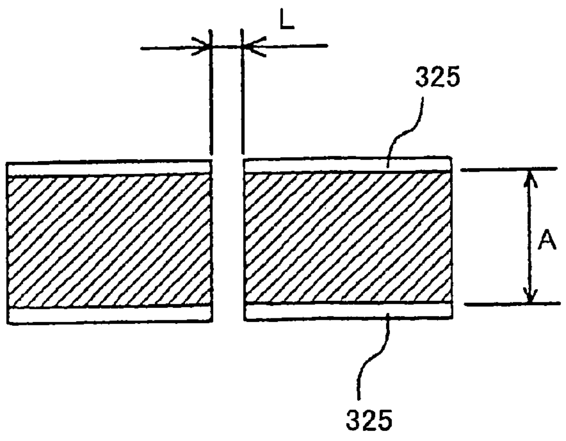
FIG. 49 is a sectional view of the groove in the lateral direction of FIG. 45 when using the silicon wafer of (110) crystalline orientation.

Moreover, the cross section of the wafer thickness orientation of groove 332*a* of the longitudinal orientation in FIG. 45 at the time of using the silicon wafer of (110) crystalline orientation comes to be shown in FIG. 49.

With the wafer of (110) crystalline orientation, the perpendicular wall of the is formed (111) and the groove width is made without limit thinly theoretically.

However, if air bubbles are generated at the time of anisotropic etching and the air bubbles are confined in the thin groove in the inside, etching liquid will no longer be supplied into the groove, and etching will not progress.

In order not to shut up air bubbles into the groove, 3 micrometers or more of the groove width L are required.

Moreover, etching will become possible if the groove width L is 1 micrometers or more in width when a means to add the supersonic wave and to make the air bubbles in the groove discharge compulsorily is used.

The groove 332*b* which, on the other hand, constitutes separation line 334*b* lengthwise in FIG. 45 at the time of using the silicon wafer of (110) crystalline orientation (the <111> orientations) cannot be set to thin groove 332*a* like the longitudinal orientation.

Then, the composition which makes thin width of lengthwise separation line 334*b* is explained in detail.

First, the taper of the orientation of slant is formed also in the silicon wafer of (110) crystalline orientation.

Figure 50:
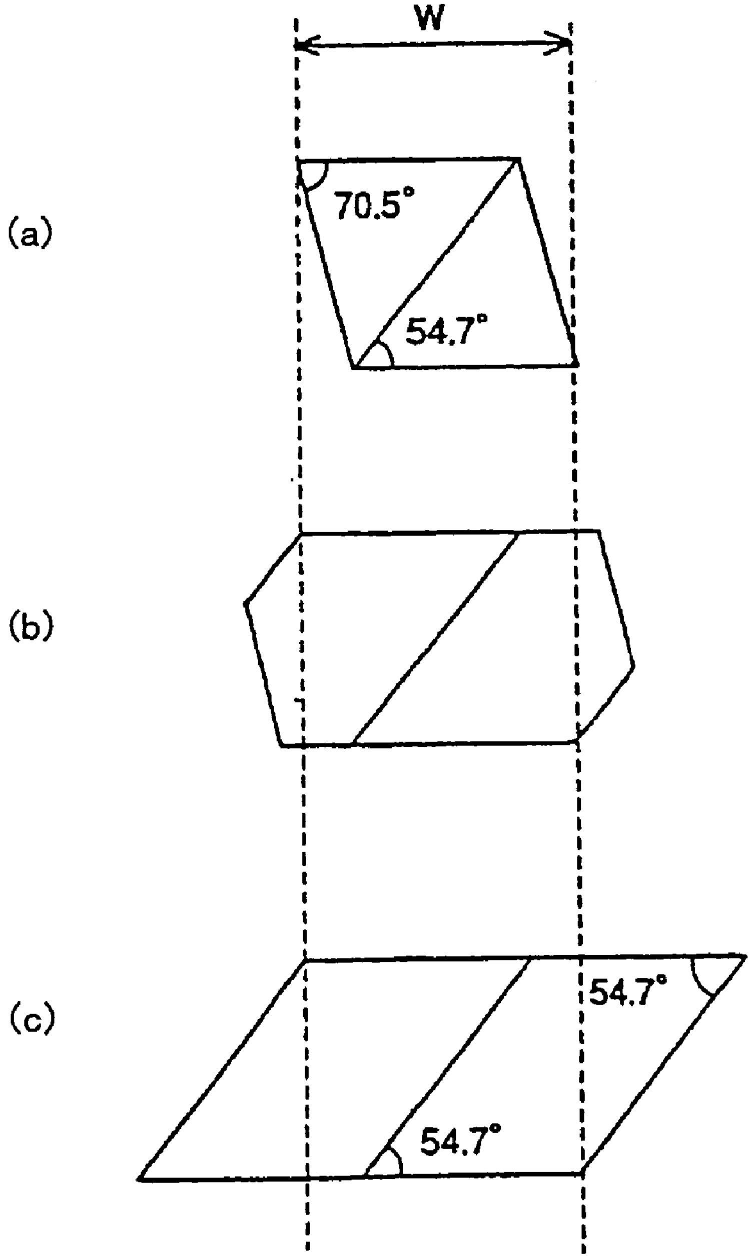
FIG. 50 is a diagram for explaining the pattern by anisotropic etching.

The pattern of the hexagon as shown in the pattern and view 50 (*b*) of the two kinds of parallelograms as shown in FIG. 50 (*a*) and (c) in the anisotropic etching of the silicon wafer of (110) crystalline orientation is obtained.

In addition, the form of quadrangle, trapezoid or pentagon on either side differs, but all over this view can also be formed and it is only the combination on either side, the explanation is omitted here.

FIG. 50 shows the three forms when becoming the same depth, when the V groove is formed.

It is the pattern with the angle of 70.5 degrees shown in FIG. 50 (*a*) of the parallelogram that the width W becomes the smallest in these, and the width is set to W0.

Therefore, the width L of the separation line 334*b* can be narrowed by putting the groove (pattern) 332*b* of the parallelogram with this angle of 70.5 degrees in order, and forming separation line 334*b*.

Then, the first example of the relation of the configuration of the two parallelograms when arranging the groove of the pattern of the parallelogram perpendicularly and constituting the separation line is explained with reference to FIG. 51.

In this example, the height H of pattern 332*b* of the parallelogram is made smaller than the pitch P of the array of the pattern 332*b* of the parallelogram.

In order for the pattern 332*b* of the two parallelograms to acquire the form partially connected in the bridge 333*b*, the range delta Δ with which the pattern 32*b* of the parallelogram has lapped must exist.

Figure 51:
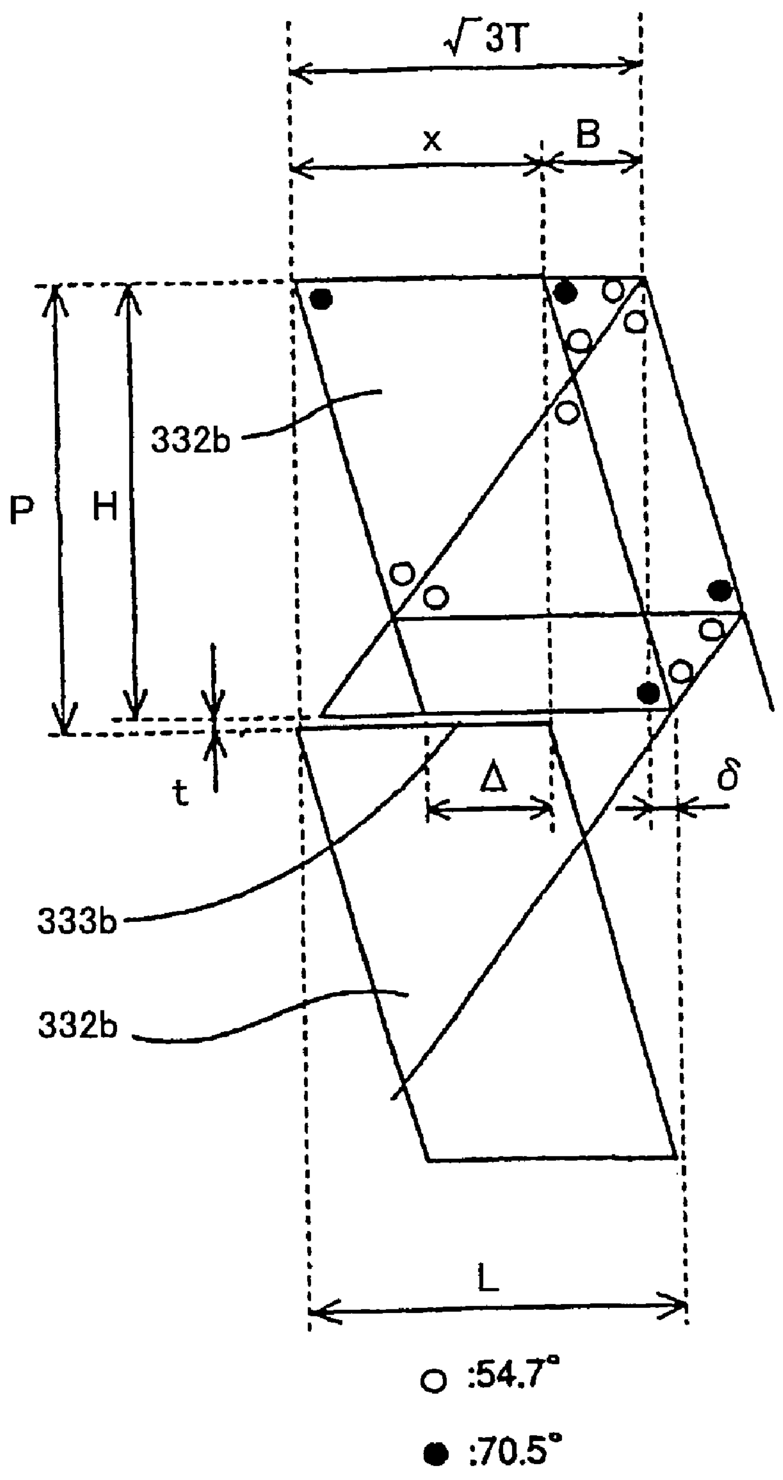
FIG. 51 is a diagram for explaining the first example when the patterns of two parallelograms are arrayed.

As is apparent from FIG. 51, the minimum separation line width L at the time of etching depth T is determined by the following formula (2).

$$L = \sqrt{3}\,T + \frac{\Delta}{2} \tag{2}$$

What is necessary in order to make the wafer penetrate is just to make the etching depth T larger than the wafer thickness.

Moreover, the height H of the pattern of the parallelogram is determined by the following formula (3).

$$P = \sqrt{6}\,T - \frac{\sqrt{2}}{2}\Delta \tag{3}$$

The width t of the bridge can be arbitrarily determined according to the required hardness. It is desirable to ensure that the width t of the bridge is adequately large for the sufficient hardness in wafer conveyance or handling after etching, it is easily separable at the time of chip separation and the wafer area can be effectively used. Moreover, it is desirable that the width t is less than the separation width of the dicing which is the general chip separation method.

Therefore, the width t of the bridge is 1–50 micrometers and the length delta Δ of the bridge is 0.5–100 micrometers. Preferably, the width t is 5–30 micrometers and the length delta Δ is 2–50 micrometers.

Although the taper (111) surface is also included besides the width t, the design value of the bridge should be determined by taking into consideration the influence of the taper.

The height H of the pattern of the parallelogram is (($\sqrt{}$6)T−0.35) micrometers to (($\sqrt{}$6)T−70) micrometers. Preferably, it is (($\sqrt{}$6)T−1.4) micrometers to (($\sqrt{}$46)T−35) micrometers.

Next, the second example of the relation of the pattern configuration of the two parallelograms when arranging the groove of the pattern of the parallelogram perpendicularly and constituting the separation line is explained with reference to FIG. 52.

This example is the case where height H of pattern 332*b* of the parallelogram is made larger than the pitch P of the array of the pattern of the parallelogram.

Figure 52:
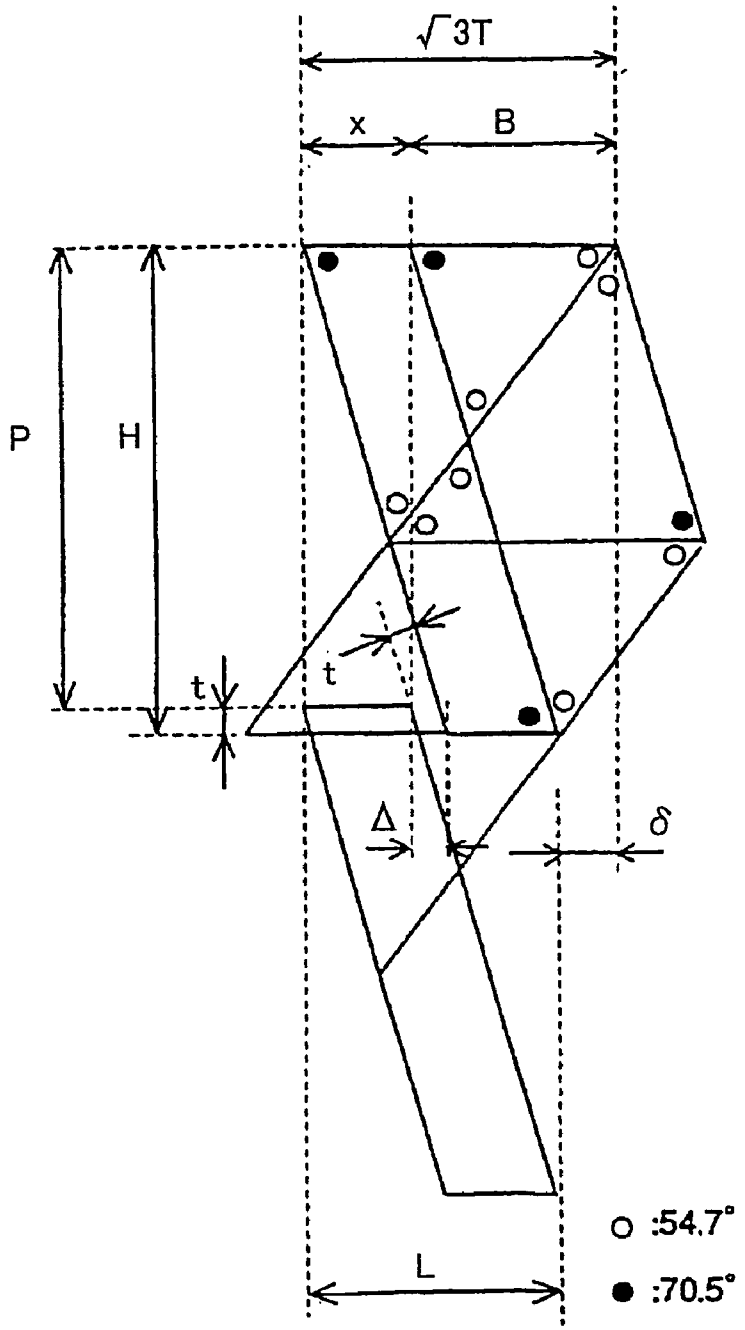
FIG. 52 is a diagram for explaining the second example when the patterns of two parallelograms are arrayed.

As is apparent from FIG. 52, the minimum separation line width L at the time of etching depth T is determined by the following formula (4).

$$L = \sqrt{3}\,T + \frac{\Delta}{2} \tag{4}$$

What is necessary in order to make the wafer penetrate is to make etching depth T larger than wafer thickness.

Moreover, the height H of the pattern 32*b* of the parallelogram is determined by the following formula (5).

$$P = \sqrt{6}\,T - \frac{\sqrt{2}}{2}\Delta \tag{5}$$

As mentioned above, the width t of the bridge can be arbitrarily determined according to the required hardness. It is desirable to ensure that the width t of the bridge is adequately large for the sufficient hardness in wafer conveyance or handling after etching, it is easily separable at the time of chip separation and the wafer area can be effectively used. Moreover, it is desirable that the width t is less than the separation width of the dicing which is the general chip separation method.

Therefore, the width t of the bridge is 1–50 micrometers and the length epsilon of the bridge is 0.5–100 micrometers. Preferably, the width t is 5–30 micrometers and the length epsilon of the bridge is 2–50 micrometers.

By this array method, the separation line width L can make only delta smaller than the array method of the first example.

The Δ (delta) is approximately equal to the width t, and the height H of the pattern of the parallelogram is (($\sqrt{}$6)T+0.7) micrometers to (($\sqrt{}$6)T+35) micrometers. Preferably, it is (($\sqrt{}$6)T+7) micrometers to (($\sqrt{}$6)T+21) micrometers.

Next, the twelfth preferred embodiment of the manufacture method of the liquid drop discharge head of the present invention is explained with reference to FIG. 53.

Figure 53:
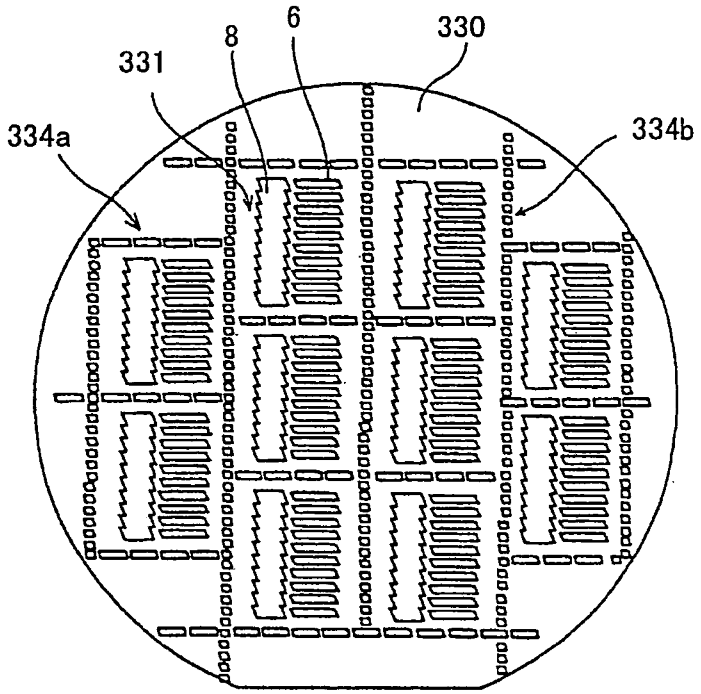
FIG. 53 is a diagram showing the chip arrangement on the wafer in order to explain the twelfth preferred embodiment of the manufacture method of the liquid drop discharge head of the present invention.

FIG. 53 shows the chip arrangement on the wafer in order to explain the manufacture method of the present embodiment.

The present embodiment makes the number of chips taken out from one wafer rather than the example of FIG. 44 by configuring the chip 331 alternately.

That is, the degree of freedom of the chip array on the wafer can improve by using the chip separation lines 334*a* and 334*b* mentioned above, and many chips can be taken by the two chips from the wafer of the same size compared with the separation method by the inseparable dicing only by the straight separation line.

Moreover, in this case, since the lengthwise is the straight line, the lengthwise is also separable using the dicing.

When positioning at the next process using the edge of the chip, the orientation of the edge separated by the dicing has the good precision, since the lateral separation line is using etching, the chip takes and the number can be done mostly.

Figure 54:
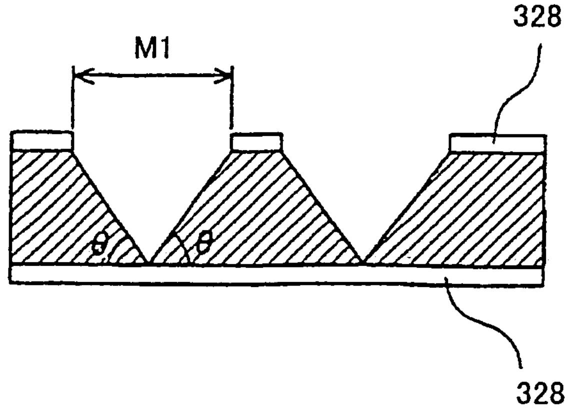
FIG. 54 is a sectional view of the wafer for explaining an example in which the pattern which constitutes a separation line is formed by anisotropic etching from one side.

Next, the example which performs etching is explained with reference to FIG. 54 and FIG. 55 from both sides of the silicon wafer.

In addition, each view is a sectional view of the wafer thickness orientation of the silicon wafer. FIG. 54 shows the example in which the pattern constituting the separation line is formed by etching from one side.

At this time, when the silicon substrate of (100) crystalline orientation is used and the taper angle theta uses the silicon substrate of 54.7 degrees and (110) crystalline orientation, it becomes 35.3 degrees.

Figure 55:
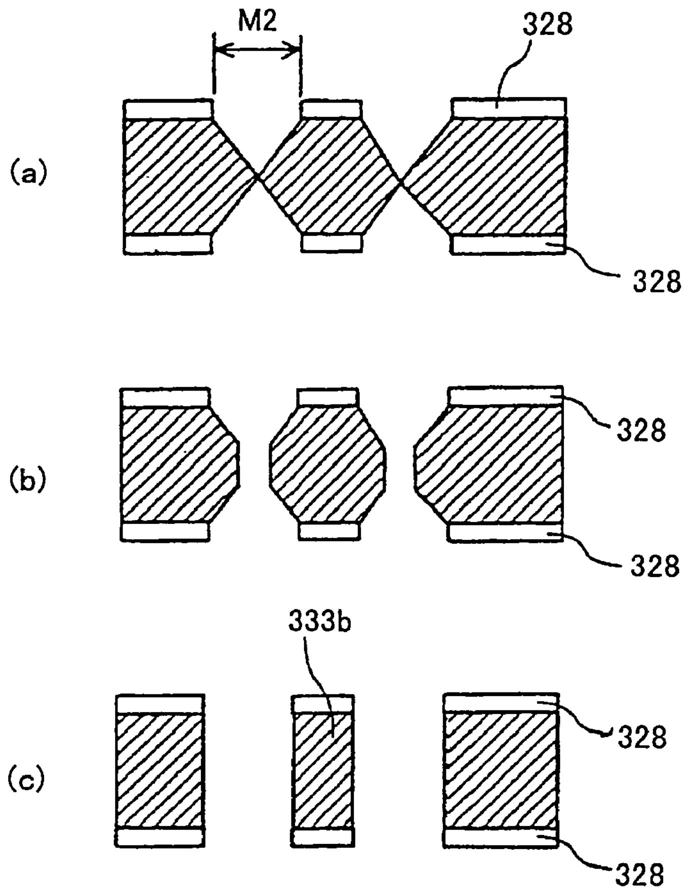
FIG. 55 is a sectional view of the wafer for explaining an example in which the pattern which constitutes a separation line is formed by anisotropic etching from both sides.

On the other hand, FIG. 55 shows an example in which the etching mask pattern 328 constituting the separation line is formed by etching from both sides.

The depth in which the wafer will be dug deep to penetration if etching is performed from both sides is good in the half of etching from one side.

Therefore, the groove width also serves as half of the width M1, and can make the separation line width thin.

In this case, if etching is further performed after the taper from both sides collides with, it will begin to be etched in the taper and the opening will become large (FIG. 55 (*b*)).

Finally, the taper is lost completely (FIG. 55 (*c*)).

Bridge 333*b* which connects between the chips by the taper being lost becomes thin, and it becomes easier to separate it.

Figure 56:
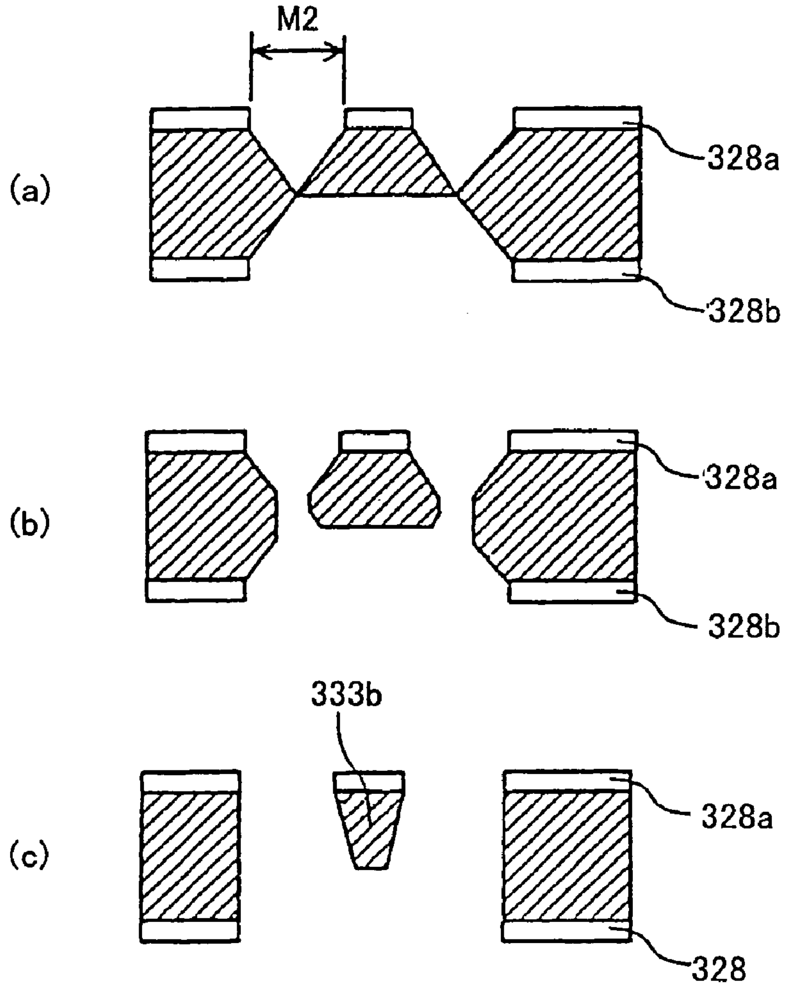
FIG. 56 is a sectional view of the wafer for explaining another example in which the pattern which constitutes a separation line is formed by anisotropic etching from both sides.

Moreover, as shown in FIG. 56, etching mask pattern 328*a* of one (top surface) of the wafer is made the same as FIG. 55.

If etching mask pattern 328*b* of the (bottom surface) of another side is formed without putting in the pattern corresponding to the bridge, and the silicon wafer is etched using these mask patterns 328*a* and 328*b*.

Finally it becomes easier for the thing thinner than the thickness of the substrate (wafer) 330 to be obtained, and for bridge 333*b* to separate the chip.

Next, the case where it laminates with the passage substrate 1 and substrate with the another electrode substrate 2 etc. is explained.

Figure 57:
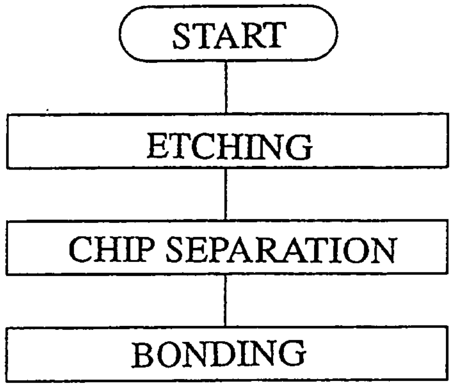
FIG. 57 is a flow chart for explaining the first example of the manufacture method when the chip structure is bonded to another substrate.

The first method bonds the chip which gave anisotropic etching to the silicon wafer (substrate), forms the chip separation line with the liquid chamber of each chip, and the common liquid chamber, separated into each chip along with this chip separation line after that, and is separated, respectively to the electrode substrate etc as shown in FIG. 57.

If it does in this way, the method of etching the chip separation line pattern from both sides can be used, the separation line can be made thin and wafer area can be used effectively.

Figure 58:
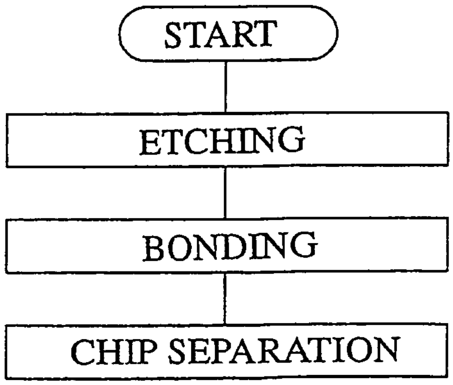
FIG. 58 is a flowchart for explaining the second example of the manufacture method when the chip structure is bonded to another substrate.

As shown in FIG. 58, the second method gives anisotropic etching to the silicon wafer (substrate), forms the chip separation line with the liquid chamber of each chip, and the common liquid chamber. It is bonded to other substrates, such as the electrode substrate and the nozzle plate, with the wafer size, without separating into each chip.

The electrode substrate and the nozzle plate may be made of the metals, such as nickel or SUS, the ceramics, such as alumina, or the glass, such as Pyrex.

In this case, although it is difficult to cut simultaneously that which laminated different-species material in this way, since the separation line of only the bridge is contained, when the silicon substrate cuts other substrates, the silicon substrate is separated easily.

Figure 59:
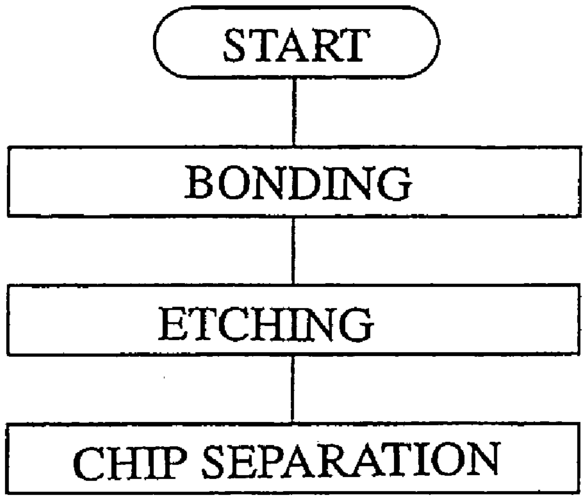
FIG. 59 is a flowchart for explaining the third example of the manufacture method when the chip structure is bonded to another substrate.

Next, as the third method, as shown in FIG. 59, it is bonded to another substrate, such as the electrode substrate, the nozzle plate, etc. in the wafer size, and etching is given after that. And the chip separation is performed by the chip separation line formed in the silicon wafer.

According to this method, by the above first and the second method, since etching is given to having had to handle that to which hardness became weak by etching after bonding, it is the laminating substrate and that hardness is strongly damaged by the handling also decreases.

Next, the ink-jet head of the fourth preferred embodiment of the liquid drop discharge head of the invention will be explained with reference to FIG. 60 and FIG. 61.

Figure 60:
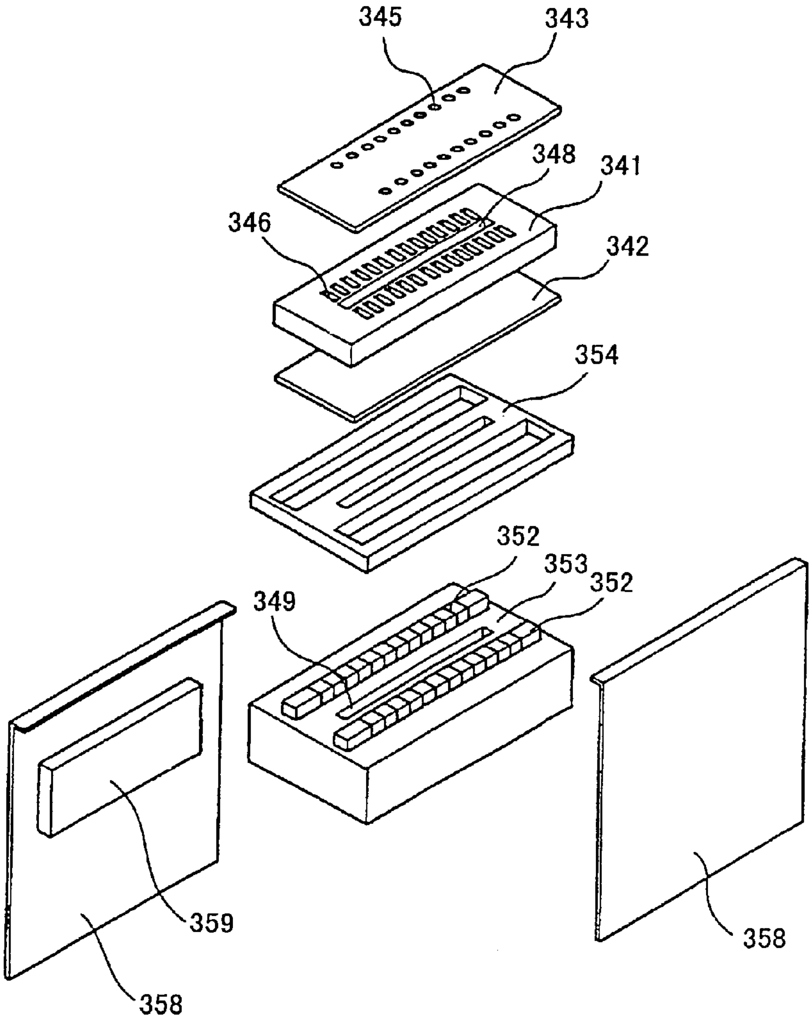
FIG. 60 is a perspective exploded view of the ink-jet head of the fourth preferred embodiment of the liquid drop discharge head of the present invention.
Figure 61:
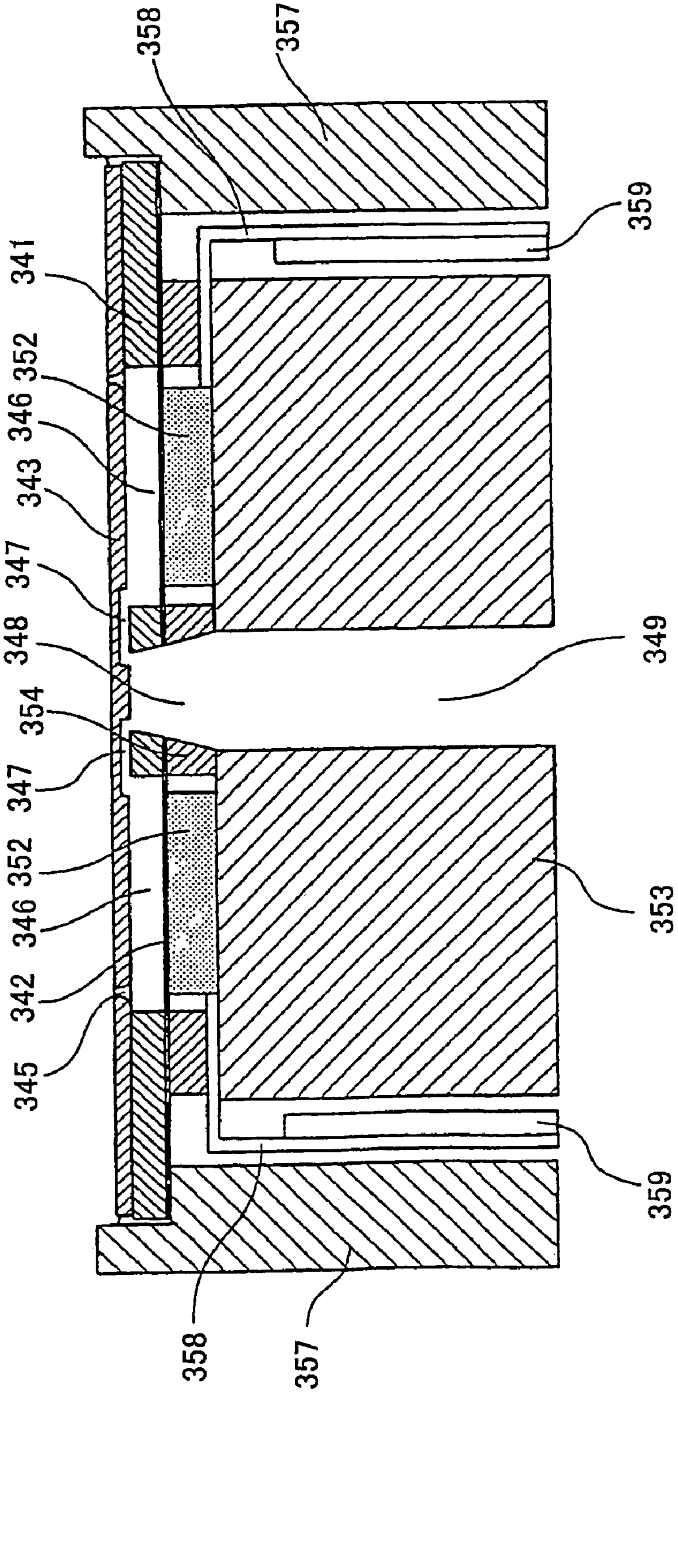
FIG. 61 is a sectional view of the ink-jet head of the fourth preferred embodiment taken along the line parallel to the longitudinal direction of the diaphragm.

FIG. 60 shows the ink-jet head of the present embodiment, and FIG. 61 is a sectional view of the ink-jet head of the present embodiment taken along the line parallel to the longitudinal direction.

The passage formation substrate 341 which formed this ink-jet head by the single-crystal-silicon substrate (liquid-chamber substrate).

It has the diaphragm 342 bonded to the bottom surface of the passage formation substrate 341, and the nozzle plate 343 is bonded to the top surface of the passage formation substrate 341.

The common liquid chamber 348 which supplies the ink to the pressurized liquid chamber 346 which is the passage (ink liquid chamber) which the nozzle 345 which carries out the discharge of the ink drop opens for free passage, and the pressurized liquid chamber 346 through the ink supply way 347 used as the fluid resistance section by these is formed.

On the outside (the liquid-chamber 346 side) of the diaphragm 342, the piezoelectric device 352 corresponding to each pressurized liquid chamber 346 is provided a drive means and bonded there. The lamination-type piezoelectric device 352 is bonded to the base substrate 353. On the circumference of the sequence of the piezoelectric devices 352, the spacer member 354 is bonded to the base substrate 353.

The piezoelectric device 352 laminates the piezoelectric-material layer and the internal electrode by turns.

In this case, it can also consider the composition which pressurizes the ink in the pressurized liquid chamber 346 using the displacement of the d33 orientation as a orientation of the piezoelectricity of the piezoelectric device 352. Alternatively, the composition which pressurizes the ink in the pressurized liquid chamber 346 using the displacement of the d31 orientation as a orientation of the piezoelectricity of the piezoelectric device 352 is possible.

The base substrate 353 and the spacer—the through hole which forms the ink feed outlet 349 for supplying the ink to the common liquid chamber 348 from the exterior is formed in the member 354

Moreover, adhesion bonding is carried out at the head flame 357 which formed the periphery section of the passage formation substrate 341, and the bottom surface side rim section of the diaphragm 342 with injection molding with the epoxy system resin or the polyphenylene ape fight, and the head flame 357 and the base substrate 353 are mutually fixed with adhesives etc. in the portion which is not illustrated.

Although the head flame 357 is divided into the two parts, it can also consist of the one part.

Furthermore, in order to give the driving signal to the piezoelectric device 352, the FPC cable 358 is connected by solder bonding, ACF (different orientation conductivity film) bonding, or wire bonding, and the drive circuit (driver IC) 359 for impressing the drive wave to each piezoelectric device 352 alternatively is mounted in the FPC cable 358.

The passage formation substrate 341 is formed by anisotropic etching of the single-crystal-silicon substrate of the crystal-face orientation (110) using the alkali etching liquid, such as the potassium hydroxide aqueous solution (KOH), and forms the through hole used as each pressurized liquid chamber 346, the groove portion used as the ink supply way 347, and the through hole used as the common liquid chamber 348, respectively.

In this case, each pressurized liquid chamber 346 is divided by the partition wall.

The diaphragm 342 is formed from the metal plate of the nickel, and is manufactured by the electro forming method.

The nozzle plate 343 forms the nozzle 345 with a diameter of 10–30 micrometers corresponding to each pressurized liquid chamber 346, and is carrying out adhesive bonding at the passage formation substrate 341.

As the nozzle plate 343, the combination of the metals, such as stainless steel and the nickel, the metal, and the resins, such as the polyimide resin film, the silicon, and the thing that consists of those combination can be used.

Moreover, in order to secure the water repellence with the ink, the water-repellent film is formed in the nozzle side (surface: discharge side of the orientation of the discharge) by the method of common knowledge, such as the plating coat or water-repellent coating.

Thus, in the constituted ink-jet head, by impressing the driving pulse voltage of 20–50V alternatively to the piezoelectric device 352, the piezoelectric device 352 to which the pulse voltage is impressed displaces in the orientation of the laminating, the diaphragm 342 is changed in the nozzle 345 orientation, the ink in the pressurized liquid chamber 346 is pressurized by the volume/volume change of the pressurized liquid chamber 346, and the discharge (injection) of the ink drop is carried out from the nozzle 345.

And in connection with the discharge of the ink drop, the fluid-pressure power in the pressurized liquid chamber 346 declines, and some negative pressure occurs in the pressurized liquid chamber 346 according to the inertia of the ink flow at this time.

Since the diaphragm 342 returns to the original position and the pressurized liquid chamber 346 becomes the original form by making impression of the voltage to the piezoelectric device 352 into the OFF state under this state, the negative pressure occurs further.

At this time, it fills with the ink in the pressurized liquid chamber 346 through the common liquid chamber 348 and the ink supply way 347 which is the fluid resistance section from the ink feed outlet 349.

After shaking of the ink meniscus side of the nozzle 345 is damp and stabilized, the pulse voltage is impressed to the piezoelectric device 352 for the following ink drop discharge, and the ink drop is discharged.

In this case, the passage formation substrate 341 forms the liquid chamber 346, the common liquid chamber 348, etc. in the silicon wafer, similar to the first preferred embodiment described above, puts in the pattern groove of the minute polygon by anisotropic etching between each chip, constitutes the chip separation line from putting this in order, and carries out separation formation at the passage formation substrate by each chip separation line.

In the above-described embodiments, the ink-jet head as a typical example of the liquid drop discharge head has been explained, but the present invention is applicable to other liquid drop discharge heads than the ink-jet head, such as the liquid drop discharge head which discharges the liquid resist as the liquid drop, and the liquid drop discharge head which discharges the sample of DNA as the liquid drop.

As described in the foregoing, the liquid drop discharge head of the present invention includes a head component chip formed by separation of a silicon wafer, the silicon wafer having a first direction and a second direction that are mutually intersected. The chip comprises: a first separation line parallel to the first direction of the silicon wafer, the chip being separated from the wafer along the first separation line by a first separation method; and a second separation line parallel to the second direction of the silicon wafer, the chip being separated from the wafer along the second separation line by a second separation method.

In the liquid drop discharge head of the present invention, the chip is separated from the wafer along the first separation line by etching, and separated from the wafer along the second separation line by dicing.

In the liquid drop discharge head of the present invention, the chip is configured in a rectangular formation having a longitudinal direction parallel to the second separation line in which the chip is separated from the wafer by dicing, and a lateral direction parallel to the first separation line in which the chip is separated from the wafer by etching.

Moreover, in the liquid drop discharge head of the present invention, the silicon wafer is of (110) crystalline orientation, the chip is formed from the silicon wafer, and the first separation line of the chip being separated from the silicon wafer by etching is parallel to <112> orientation of the silicon wafer.

Moreover, in the liquid drop discharge head of the present invention, the discharge head comprises a liquid-chamber formation member which provides a liquid chamber, a nozzle formation member which provides a nozzle, and an electrode formation member which provides an electrode, and that the chip constitutes at least one of the liquid-chamber formation member, the nozzle formation member, and the electrode formation member.

Furthermore, in the liquid drop discharge head of the present invention, the chip is provided without any bridge portion at an intersection between the first separation line and the second separation line.

The manufacture method of the liquid drop discharge head of the present invention comprises the steps of: etching the silicon wafer along first separation lines parallel to the first direction of the silicon wafer in order to separate a plurality of chips from each other along the first separation lines; and dicing the silicon wafer along second separation lines parallel to the second direction of the silicon wafer to separate the plurality of chips from the silicon wafer along the first and second separation lines.

In the manufacture method of the present invention, each of the plurality of chips is configured in a rectangular formation having a longitudinal direction parallel to the second separation line in which the chip is separated from the silicon wafer by the dicing step, and a lateral direction parallel to the first separation line in which the chip is separated from the silicon wafer by the etching step.

In the manufacture method of the present invention, the silicon wafer is of (110) crystalline orientation, and the plurality of chips, configured in a rectangular formation, are arranged in the silicon wafer, and the first separation lines for the plurality of chips to be separated from the silicon wafer by the etching step are parallel to <112> orientations of the silicon wafer.

In the manufacture method of the present invention, the first separation lines for the plurality of chips to be separated from the silicon wafer by the etching step are set to be 1 micrometers or more in width.

The manufacture method of the liquid drop discharge head of the present invention comprises the steps of: etching the silicon wafer along first separation lines parallel to the first direction of the silicon wafer, in order to separate a plurality of chips from the silicon wafer along the first separation lines; and dicing the silicon wafer along second separation lines parallel to the second direction of the silicon wafer, in order to separate the plurality of chips from the silicon wafer along the second separation lines. In the manufacture method, the etching step is performed such that the individual chips are not completely separated after the etching step, and the dicing step is performed so that the individual chips are completely separated after the dicing step.

In the manufacture method of the present invention, the plurality of chips are arranged in a set of rows of chips in parallel with the first direction of the silicon wafer such that the first separation lines of adjacent rows of the chips are staggered in a direction parallel to the second separation lines.

In the manufacture method of the present invention, the second separation lines are provided such that the second separation line of one of the plurality of chips has a width large enough to project to a range of a neighboring chip on said one of the plurality of chips in the silicon wafer.

Moreover, in the manufacture method of the present invention, the plurality of chips are separated from the silicon wafer without any bridge portions at intersections between the first separation lines and the second separation lines.

In the manufacture method of the present invention, the etching step is performed to form the first separation lines in the silicon wafer by etching from both top and bottom surfaces of the silicon wafer at the same time.

In the manufacture method of the present invention, the etching step is performed to form the first separation lines in the silicon wafer by etching, at the same time as formation of a head component chip structure.

The micro device of the present invention includes a chip formed by separation of a silicon wafer, and this chip is provided similar to the head component chip in the liquid drop discharge head of the invention. In the micro chip, the first and second separation methods are different from each other and selected from among dicing, etching, sand blasting, wire saw processing, water jet processing, and laser processing.

According to the liquid drop discharge head of the present invention, the head component chip is separated from the silicon wafer by etching the wafer along the separation line parallel to the first direction of the wafer and by dicing the wafer along the separation line parallel to the second direction of the wafer. It is possible to provide easy positioning with other parts. The degree of freedom of the chip arrangement on the silicon wafer is raised, and the number of the resulting chips from the silicon wafer is increased. Thus, the yield improves, and low-cost manufacture can be attained.

According to the manufacture method of the liquid drop discharge head of the present invention, the degree of freedom of the chip arrangement on the silicon wafer is raised, and the number of the resulting chips from the silicon wafer is increased. Thus, the yield improves, and low-cost manufacture can be attained.

According to the micro device of the present invention, the micro device is provided a kind of the liquid drop discharge head of the invention, the number of the resulting chips from the silicon wafer is increased, the yield improves, and low-cost manufacture can be attained.

According to the ink-jet head of the present invention, the ink-jet head is provided as a kind of the liquid drop discharge head of the invention, and the productivity of the ink-jet head can be raised and low-cost manufacture can be attained.

According to the ink cartridge of the present invention, the ink tank which supplies the ink to the ink-jet head, and the ink-jet head which discharges the ink drop are integrally formed, and the liquid drop discharge head of the invention is provided as the ink-jet head. The productivity of the ink cartridge can be raised and low-cost manufacture can be attained.

According to the ink-jet printing device of the present invention, the liquid drop discharge head of the invention is provided as the ink-jet head which discharges the ink drop, and the productivity of the ink-jet printing device can be raised and low-cost manufacture can be attained.

The invention claimed is:

1. A liquid drop discharge head including a head component chip formed by separation of a silicon wafer, the silicon wafer having a first direction and a second direction that are mutually intersected, characterized by the chip comprising:

a first separation line parallel to the first direction of the silicon wafer, the chip being separated from the wafer along the first separation line by a first separation method; and a second separation line parallel to the second direction of the silicon wafer, the chip being separated from the wafer along the second separation line by a second separation method, wherein said silicon wafer is of (110) crystalline orientation, the chip is formed from said silicon wafer, and the first separation line of the chip separated from said silicon wafer by etching is parallel to <112> orientation of said silicon wafer.

2. The liquid drop discharge head of claim 1 characterized in that the chip is separated from the wafer along the first separation line by etching, and separated from the wafer along the second separation line by dicing.

3. The liquid drop discharge head of claim 2 characterized in that the chip is configured in a rectangular formation having a longitudinal direction parallel to the second separation line in with the chip is separated from the wafer by dicing, and a lateral direction parallel to the first separation line in which the chip is separated from the wafer by etching.

4. The liquid drop discharge head of claim 1 characterized in that the discharge head comprises a liquid-chamber formation member which provides a liquid chamber, a nozzle formation member which provides a nozzle, and an electrode formation member which provides an electrode, and that the chip constitutes at least one of the liquid-chamber formation member, the nozzle formation member, and the electrode formation member.

5. The liquid drop discharge head of claim 1 characterized in that the chip is provided without any bridge portion at an intersection between the first separation line and the second separation line.

6. A micro device including a chip formed by separation of a silicon wafer, the silicon wafer having a first direction and a second direction that are mutually intersected, characterized by the chip comprising:

a first separation line parallel to the first direction of the silicon wafer, the chip being separated from the wafer along the first separation line by a first separation method; and a second separation line parallel to the second direction of the silicon wafer, the chip being separated from the wafer along the second separation line by a second separation method, wherein the first and second separation methods are different from each other and selected from among dicing, etching, sand blasting, wire saw processing, water jet processing, and laser processing, wherein said silicon wafer is of (110) crystalline orientation, the chip is formed from said silicon wafer, and the first separation line of the chip separated from said silicon wafer by etching is parallel to <112> orientation of said silicon wafer.

7. An ink-jet head including a nozzle which discharges an ink drop, a liquid chamber which communicates with the nozzle, and a pressure generating unit which generates pressure to pressurize ink contained in the liquid chamber, the ink-jet head including a head component chip formed by separation of a silicon wafer, the silicon wafer having a first direction and a second direction that are mutually intersected, characterized by the chip comprising:

a first separation line parallel to the first direction of the silicon wafer, the chip being separated from the wafer along the first separation line by a first separation method; and a second separation line parallel to the second direction of the silicon wafer, the chip being separated from the wafer along the second separation line by a second separation method, wherein said silicon wafer is of (110) crystalline orientation, the chip is formed from said silicon wafer, and the first separation line of the chin separated from said silicon wafer by etching is parallel to <112> orientation of said silicon wafer.

8. An ink cartridge in which an ink-jet head and an ink tank are integrally formed, the ink-jet head discharging an ink drop, and the ink tank supplying ink to the ink-jet head, the ink-jet head including a head component chip formed by separation of a silicon wafer, the silicon wafer having a first direction and a second direction that are mutually intersected, characterized by the chip comprising:

a first separation line parallel to the first direction of the silicon wafer, the chip being separated from the wafer along the first separation line by a first separation method; and a second separation line parallel to the second direction of the silicon wafer, the chip being separated from the wafer along the second separation line by a second separation method, wherein said silicon wafer is of (110) crystalline orientation, the chin is formed from said silicon wafer, and the first separation line of the chin separated from said silicon wafer by etching is parallel to <112> orientation of said silicon wafer.

9. An ink-jet printing device including an ink-jet head which discharges an ink drop, the ink-jet head including a head component chip formed by separation of a silicon wafer, the silicon wafer having a first direction and a second direction that are mutually intersected, characterized by the chip comprising:

a first separation line parallel to the first direction of the silicon wafer, the chip being separated form the wafer along the first separation line by a first separation method; and a second separation line parallel to the second direction of the silicon wafer, the chip being separated from the wafer along the second separation line by a second separation method, wherein said silicon wafer is of (110) crystalline orientation, the chip is formed from said silicon wafer, and the first separation line of the chip separated from said silicon wafer by etching is parallel to <112> orientation of said silicon wafer.

10. A liquid drop discharge head including a head component chip formed by separation of a silicon wafer, the silicon wafer having a first direction and a second direction that are mutually intersected, characterized by the chip comprising:

a first separation line parallel to the first direction of the silicon wafer, a slit being partially formed on the first separation line to penetrate the silicon wafer by a first separation method, the chip being separated from the silicon wafer along the first separation line; and a second separation line parallel to the second direction of the silicon wafer, the chip being separated from the wafer along the second separation line by a second separation method, wherein said silicon wafer is of (110) crystalline orientation, the chip is formed from said silicon wafer, and the first separation line of the chip separated from said silicon wafer by etching is parallel to <112> orientation of said silicon wafer.

11. The liquid drop discharge head of claim 10 characterized in that the chip is separated from the wafer along the first separation line by chopper dicing, mid separated from the wafer along the second separation line by dicing.

12. The liquid drop discharge head of claim 10 characterized in that the chip after the separation includes an end surface having a level difference of 0.5 micrometers or less.

13. A liquid drop discharge head including a head component chip formed by separation of a silicon wafer, the silicon wafer having a first direction and a second direction that are mutually intersected, characterized by the chip comprising:

a first separation line parallel to the first direction of the silicon wafer, a slit being partially formed on the first separation line to penetrate the silicon wafer by a first separation method, the chip being separated from the silicon wafer along the first separation line; and a second separation line parallel to the second direction of the silicon wafer, the chip being separated from the wafer along the second separation line by a second separation method, wherein the liquid drop discharge head is characterized in that the slit is configured to meet the following formula $$\sqrt{r^2-(r-t)^2} \leqq L$$

where L is a length of the slit formed in the wafer, r is a radius of a dicing blade, and t is a thickness of the wafer.

14. The liquid drop discharge head of claim 10 characterized in that the discharge head comprises a liquid-chamber formation member which provides a liquid chamber, a nozzle formation member which provides a nozzle, and an electrode formation member which provides an electrode, and that the chip constitutes at least one of the liquid-chamber formation member, the nozzle formation member, and the electrode formation member.

15. A micro device including a chip formed by separation of a silicon wafer, the silicon wafer having a first direction and a second direction that are mutually intersected, characterized by the chip comprising:

a first separation line parallel to the first direction of the silicon wafer, a slit being partially formed on the first separation line to penetrate the silicon wafer by a first separation method, the chip being separated from the silicon wafer along the first separation line; and a second separation line parallel to the second direction of the silicon wafer, the chip being separated from the wafer along the second separation line by a second separation method, wherein said silicon wafer is of (110) crystalline orientation, the chip is formed from said silicon wafer, and the first separation line of the chip separated from said silicon wafer by etching is parallel to <112> orientation of said silicon wafer.

16. An ink-jet head including a nozzle which discharges an ink drop, a liquid chamber which communicates with the nozzle, and a pressure generating unit which generates pressure to pressurize ink contained in the liquid chamber, the ink-jet head including a head component chip formed by separation of a silicon wafer, the silicon wafer having a first direction and a second direction that are mutually intersected, characterized by the chip comprising:

a first separation line parallel to the first direction of the silicon wafer, a slit being partially formed on the first separation line to penetrate the silicon wafer by a first separation method, the chip being separated from the silicon wafer along the first separation line; and a second separation line parallel to the second direction of the silicon wafer, the chip being separated from the wafer along the second separation line by a second separation method, wherein said silicon wafer is of (110) crystalline orientation, the chip is formed from said silicon wafer, and the first separation line of the chip separated from said silicon wafer by etching is parallel to <112> orientation of said silicon wafer.

17. An ink cartridge in which an ink-jet head and an ink tank are integrally formed, the ink-jet head discharging an ink drop, and the ink tank supplying ink to the ink-jet head, the ink-jet head including a head component chip formed by separation of a silicon wafer, the silicon wafer having a first direction and a second direction that are mutually intersected, characterized by the chip comprising:

a first separation line parallel to the first direction of the silicon wafer, a slit being partially formed on the first separation line to penetrate the silicon wafer by a first separation method, the chip being separated from the silicon wafer along the first separation line; and a second separation line parallel to the second direction of the silicon wafer, the chip being separated from the wafer along the second separation line by a second separation method, wherein said silicon wafer is of (110) crystalline orientation, the chip is formed from said silicon wafer, and the first separation line of the chin separated from said silicon wafer by etching is parallel to <112> orientation of said silicon wafer.

18. An ink-jet printing device including an ink-jet head which discharges an ink drop, the ink-jet head including a head component chip formed by separation of a silicon wafer, the silicon wafer having a first direction and a second direction that are mutually intersected, characterized by the chip comprising:

a first separation line parallel to the first direction of the silicon wafer, a slit being partially formed on the first separation line to penetrate the silicon wafer by a first separation method, the chip being separated from the silicon wafer along the first separation line; and a second separation line parallel to the second direction of the silicon wafer, the chip being separated from the wafer along the second separation line by a second separation method, wherein said silicon wafer is of (110) crystalline orientation, the chip is formed from said silicon wafer, and the first separation line of the chip separated from said silicon wafer by etching is parallel to <112> orientation of said silicon wafer.

* * * * *